(12) United States Patent
Usami et al.

(10) Patent No.: US 10,431,556 B2
(45) Date of Patent: Oct. 1, 2019

(54) SEMICONDUCTOR DEVICE INCLUDING SEMICONDUCTOR CHIPS MOUNTED OVER BOTH SURFACES OF SUBSTRATE

(71) Applicant: Micron Technology, Inc., Boise, ID (US)

(72) Inventors: Sensho Usami, Akita (JP); Koji Hosokawa, Akita (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/699,703

(22) Filed: Sep. 8, 2017

(65) Prior Publication Data

US 2017/0373021 A1 Dec. 28, 2017

Related U.S. Application Data

(63) Continuation of application No. 15/229,688, filed on Aug. 5, 2016, now Pat. No. 9,799,611, which is a
(Continued)

(30) Foreign Application Priority Data

Mar. 31, 2014 (JP) ................................. 2014-072117

(51) Int. Cl.
*H01L 23/48* (2006.01)
*H01L 23/52* (2006.01)
(Continued)

(52) U.S. Cl.
CPC .......... *H01L 23/562* (2013.01); *H01L 21/563* (2013.01); *H01L 23/3128* (2013.01);
(Continued)

(58) Field of Classification Search
CPC ........................... H01L 25/0657; H01L 24/17
(Continued)

(56) References Cited

U.S. PATENT DOCUMENTS 9,418,968 B2 8/2016 Usami et al.
2006/0019484 A1 1/2006 Chen et al.
(Continued)

FOREIGN PATENT DOCUMENTS

JP 2006210566 A 6/2006
JP 2007287906 A 11/2007
JP 2010103348 A 5/2010

*Primary Examiner* — Theresa T Doan
(74) *Attorney, Agent, or Firm* — Perkins Coie LLP

(57) ABSTRACT

A semiconductor chip 10 flip-chip mounted on a first surface 32 of a wiring substrate 30, a semiconductor chip 20 flip-chip mounted on a second surface 33 of the wiring substrate 30, a sealing resin 71 covering the semiconductor chip 10, a sealing resin 72 covering the semiconductor chip 20, a plurality of conductive posts provided to penetrate through the sealing resin 72, and a plurality of solder balls mounted on second ends of the plurality of conductive posts exposed from the sealing resin 72 are provided; and the mounting directions of the semiconductor chips 10 and 20 are mutually different by 90°. Both of the planar shapes of the semiconductor chips 10 and 20 are rectangular shapes, the semiconductor chip 10 is mounted so that the long sides thereof are parallel to the long sides of the wiring substrate 30, and the semiconductor chip 20 is mounted so that the long sides thereof are perpendicular to the long sides of the wiring substrate 30.

23 Claims, 18 Drawing Sheets

Related U.S. Application Data continuation of application No. 14/668,724, filed on Mar. 25, 2015, now Pat. No. 9,418,968.

(51) Int. Cl.

| | | |
|---|---|---|
| *H01L 23/00* | (2006.01) | |
| *H01L 25/065* | (2006.01) | |
| *H01L 23/31* | (2006.01) | |
| *H01L 23/498* | (2006.01) | |
| *H01L 21/56* | (2006.01) | |
| *H01L 25/10* | (2006.01) | |
| *H01L 25/00* | (2006.01) | |

(52) U.S. Cl.
CPC ........ *H01L 23/49816* (2013.01); *H01L 24/97* (2013.01); *H01L 25/0657* (2013.01); *H01L 25/105* (2013.01); *H01L 25/50* (2013.01); H01L 21/561 (2013.01); H01L 24/13 (2013.01); H01L 24/16 (2013.01); H01L 24/27 (2013.01); H01L 24/29 (2013.01); H01L 24/32 (2013.01); H01L 24/75 (2013.01); H01L 24/81 (2013.01); H01L 24/83 (2013.01); H01L 24/92 (2013.01); H01L 2224/12105 (2013.01); H01L 2224/131 (2013.01); H01L 2224/13147 (2013.01); H01L 2224/16227 (2013.01); H01L 2224/2732 (2013.01); H01L 2224/27436 (2013.01); H01L 2224/2919 (2013.01); H01L 2224/2939 (2013.01); H01L 2224/29294 (2013.01); H01L 2224/32225 (2013.01); H01L 2224/73104 (2013.01); H01L 2224/73204 (2013.01); H01L 2224/75745 (2013.01); H01L 2224/81191 (2013.01); H01L 2224/81201 (2013.01); H01L 2224/81205 (2013.01); H01L 2224/83101 (2013.01); H01L 2224/83104 (2013.01); H01L 2224/83191 (2013.01); H01L 2224/92125 (2013.01); H01L 2224/97 (2013.01); H01L 2225/06517 (2013.01); H01L 2225/06548 (2013.01); H01L 2225/06558 (2013.01); H01L 2225/06572 (2013.01); H01L 2225/06586 (2013.01); H01L 2225/1023 (2013.01); H01L 2225/1058 (2013.01); H01L 2924/00014 (2013.01); H01L 2924/12042 (2013.01); H01L 2924/15311 (2013.01); H01L 2924/181 (2013.01); H01L 2924/18161 (2013.01); H01L 2924/3511 (2013.01)

(58) Field of Classification Search
USPC .......................................................... 257/737
See application file for complete search history.

(56) References Cited

U.S. PATENT DOCUMENTS

| | | | |
|---|---|---|---|
| 2006/0163745 | A1 | 7/2006 | Yamashita et al. |
| 2007/0241463 | A1 | 10/2007 | Yamaguchi et al. |
| 2008/0265434 | A1* | 10/2008 | Kurita ................... H01L 21/563 257/777 |
| 2010/0102438 | A1 | 4/2010 | Watanabe et al. |
| 2010/0252937 | A1* | 10/2010 | Uchiyama ............. H01L 21/486 257/777 |
| 2015/0200175 | A1* | 7/2015 | Hatori .................... H01L 24/16 257/737 |
| 2015/0279820 | A1 | 10/2015 | Hosokawa et al. |

* cited by examiner

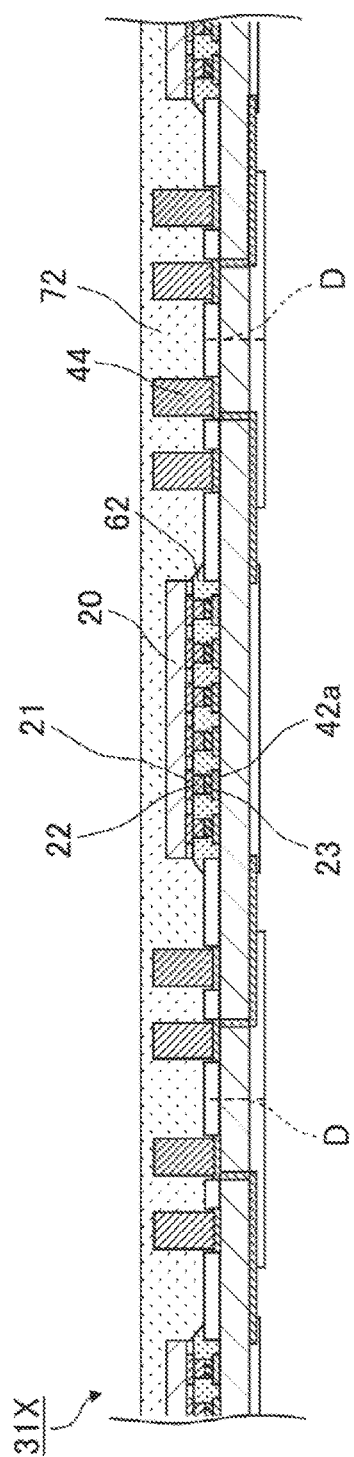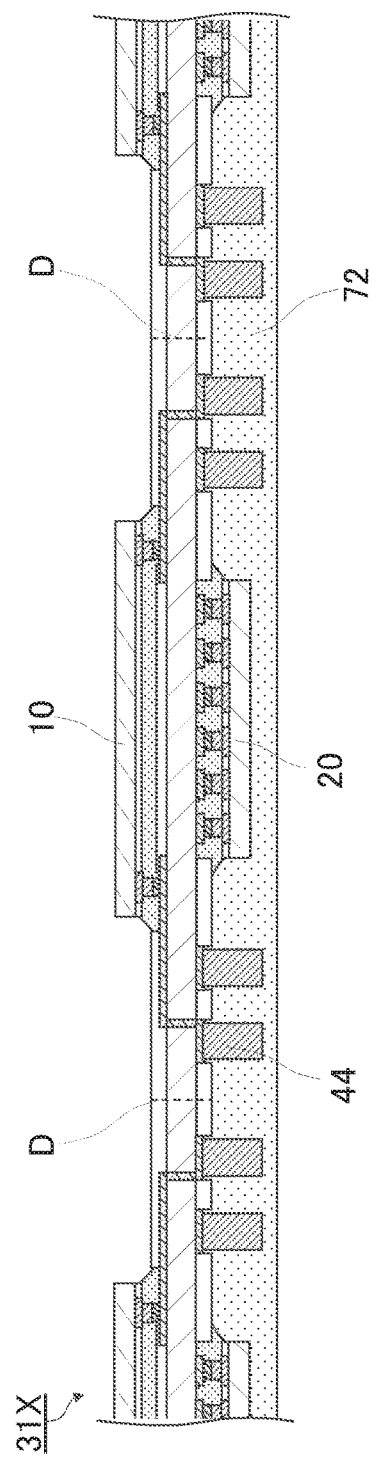
FIG. 10
FIG. 11

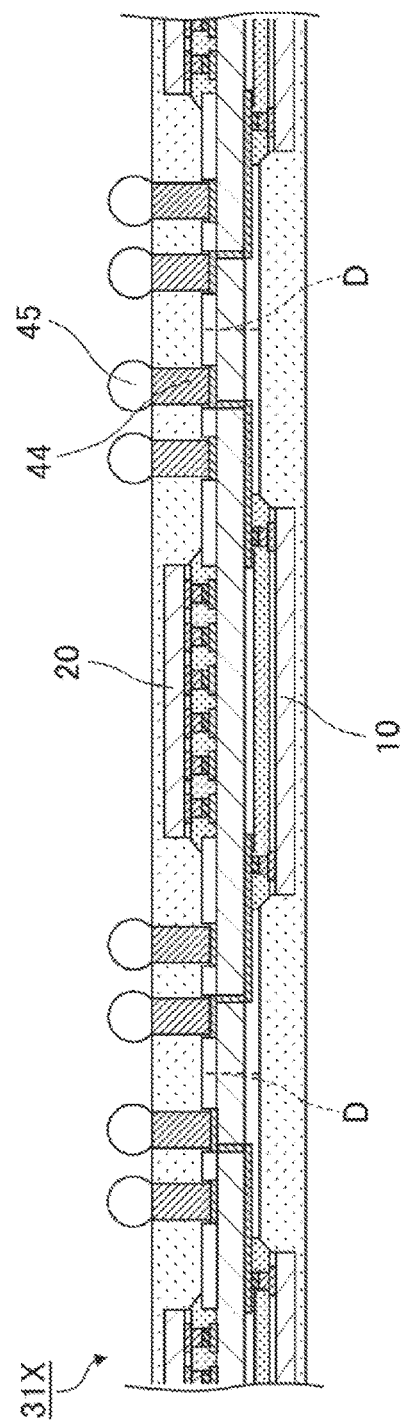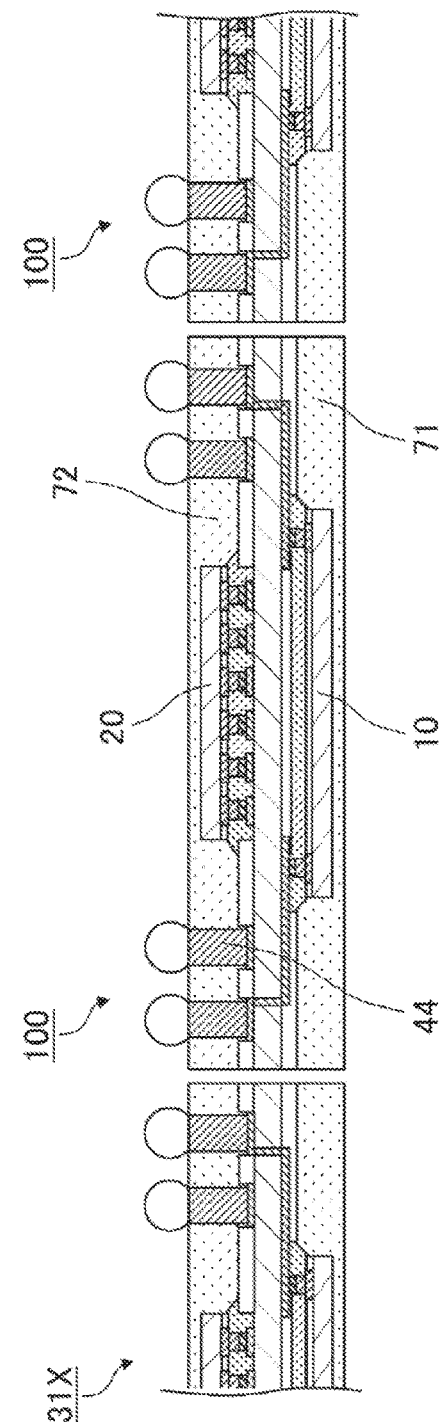

SEMICONDUCTOR DEVICE INCLUDING SEMICONDUCTOR CHIPS MOUNTED OVER BOTH SURFACES OF SUBSTRATE

CROSS-REFERENCE TO RELATED APPLICATION

This application is a continuation of U.S. patent application Ser. No. 15/229,688, filed Aug. 5, 2016, which is a continuation of U.S. patent application Ser. No. 14/668,724, filed Mar. 25, 2015, now U.S. Pat. No. 9,418,968, which is based upon and claims the benefit of priority from Japanese Patent Application No. 2014-072117, filed on Mar. 31, 2014, each of which is incorporated herein in its entirety by reference.

FIELD OF THE INVENTION

The present invention relates to a semiconductor device, and more particularly to such a device having two semiconductor chips mounted over both surfaces of a wiring substrate. The present invention may also relate to a method of manufacturing such a device.

BACKGROUND

Recently, a semiconductor device including a plurality of semiconductor chips flip-chip mounted on a rigid substrate has been proposed. For example, Japanese Patent Application Laid-Open No. 2006-210566 discloses a semiconductor device of a type that semiconductor chips are flip-chip mounted respectively on both surfaces of a wiring substrate. When the semiconductor chips are flip-chip mounted respectively on the both surfaces of the substrate in this manner, packaging of a higher density is enabled.

However, in the semiconductor device described in Japanese Patent Application Laid-Open No. 2006-210566, since the semiconductor chip and external terminals are disposed on a single flat surface (back surface) of the substrate, the difference in the heights of the back surface of the semiconductor chip and the distal ends of the external terminals, i.e., a so-called standoff is extremely small. Therefore, there has been a problem that it is difficult to mount that on a substrate surface having asperities. The substrate surface having asperities corresponds to, for example, the surface of a lower-side package of a semiconductor device having a PoP (Package on Package) structure. Therefore, it is difficult to use the semiconductor device described in Japanese Patent Application Laid-Open No. 2006-210566 as an upper-side package of a semiconductor device having the PoP structure.

In order to solve such a problem, there is a conceivable method in which conductive posts are projected from a wiring substrate like a semiconductor device described in Japanese Patent Application Laid-Open No. 2007-287906. However, sometimes there has been a case in which, when the conductive posts are projected from the wiring substrate, the standoff becomes excessive depending on the structure of a lower-side package, and the overall thickness is increased more than needed. Moreover, since the semiconductor device described in Japanese Patent Application Laid-Open No. 2007-287906 is not for mounting or flip-chip mounting semiconductor chips on both surfaces of the substrate, it is unknown how it should be applied to a semiconductor device of a type in which semiconductor chips are flip-chip mounted respectively on both surfaces of a wiring substrate.

Moreover, although it is not a semiconductor device including flip-chip mounted semiconductor chips, Japanese Patent Application Laid-Open No. 2010-103348 discloses a structure in which: semiconductor chips are respectively mounted on both surfaces of a wiring substrate, these semiconductor chips are covered with a sealing resin in order to suppress warpage of the semiconductor device, and the wiring substrate and external terminals are connected via through-hole conductors provided to penetrate through the sealing resin. However, if the semiconductor chips are to be flip-chip mounted on the wiring substrate, a process such as pressing the semiconductor chips against the wiring substrate while applying load and ultrasonic waves is required; however, since the semiconductor device described in Japanese Patent Application Laid-Open No. 2010-103348 employs wire bonding, a problem specific to flip-chip mounting, for example, a problem such as deformation of the wiring substrate due to application of load and ultrasonic waves is not caused.

Furthermore, even if the sizes of first and second memory chips on the upper and lower surfaces of the wiring substrate and the thicknesses of first and second sealing resins on the upper and lower surfaces of the wiring substrate are the same, disposing a plurality of conductive posts around the layer of the second sealing resin on the lower surface of the wiring substrate may cause the layer of the second sealing resin on the lower surface of the wiring substrate to be smaller than the layer of the first sealing resin on the upper surface of the wiring substrate and may cause minus warpage (concave warpage) in a package in an upper level. If the package in a lower level is plus-warped (convex warped) and the minus warpage of the package in the upper level is large, the warpage directions of the packages in the upper and lower levels become mutually opposite, and the package in the upper level cannot be mounted for lamination on the package in the lower level.

SUMMARY

In one embodiment, there is provided a semiconductor device comprising: a substrate having a rectangular shape; a first semiconductor chip having a rectangular shape, and the first semiconductor chip being mounted over a top surface of the substrate so that a long side of the first semiconductor chip is parallel to a long side of the substrate; a first sealing resin provided over the top surface of the substrate; a second semiconductor chip having a rectangular shape, and the second semiconductor chip being mounted over a bottom surface of the substrate so that a long side of the second semiconductor chip is perpendicular to the long side of the substrate; a second sealing resin provided over the bottom surface of the substrate; and a plurality of external terminals provided on the bottom surface of the substrate so as to expose from the second sealing resin.

In another embodiment, there is provided a semiconductor device comprising: a substrate including a first substrate side and a second substrate side perpendicular to the first substrate side, and the first substrate side being longer than the second substrate side in planar view; a first semiconductor chip including a first side and a second side perpendicular to the first side, the first side being longer than the second side in planar view, and the first semiconductor chip being mounted over a top surface of the substrate so that the first side of the first semiconductor chip faces to the first substrate side of the substrate; a first sealing resin provided on the top surface of the substrate to cover the first semiconductor chip; a second semiconductor chip including a third side and a fourth side perpendicular to the third side, the third side being longer than the fourth side in planer view, and the second semiconductor chip being mounted over a bottom surface of the substrate so that the third side of the second semiconductor chip faces to the second substrate side of the substrate; a plurality of conductive posts provided on the bottom surface of the substrate; a second sealing resin provided on the bottom surface of the substrate to cover the second semiconductor chip and the conductive posts, and parts of the conductive posts being exposed from the second sealing resin; and a plurality of solder balls provided on the parts of the conductive posts.

According to the present invention, since solder balls are mounted on second ends of conductive posts, which penetrate through a sealing resin, a standoff can be sufficiently ensured. Moreover, since the long sides of a first semiconductor chip are parallel to the long sides of a substrate, the difference in the amounts of the sealing resin in the long-side direction and the short-side direction of the substrate can be reduced, and warpage of a semiconductor device can be reduced. Moreover, since the mounting directions of two semiconductor chips respectively mounted on both surfaces of the substrate are mutually different by 90°, the layout of wiring patterns on the substrate is not locally concentrated, and the degree of freedom of the layout can be increased. Moreover, since the position at which load is concentrated when the semiconductor chips are mounted on the substrate by using a bonding tool can be retained by a stage, the substrate can be prevented from being deformed.

BRIEF DESCRIPTION OF THE DRAWINGS

The above features and advantages of the present invention will be more apparent from the following description of certain preferred embodiments taken in conjunction with the accompanying drawings, in which:

FIG. 10 is a process drawing for explaining the manufacturing method of the semiconductor device 100;

FIG. 11 is a process drawing for explaining the manufacturing method of the semiconductor device 100;

FIG. 14 is a process drawing for explaining the manufacturing method of the semiconductor device 100;

FIG. 15 is a process drawing for explaining the manufacturing method of the semiconductor device 100;

DETAILED DESCRIPTION OF THE EMBODIMENTS

This invention will be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, preferred embodiments of the present invention will be explained in detail with reference to accompanying drawings.

Figure 1:
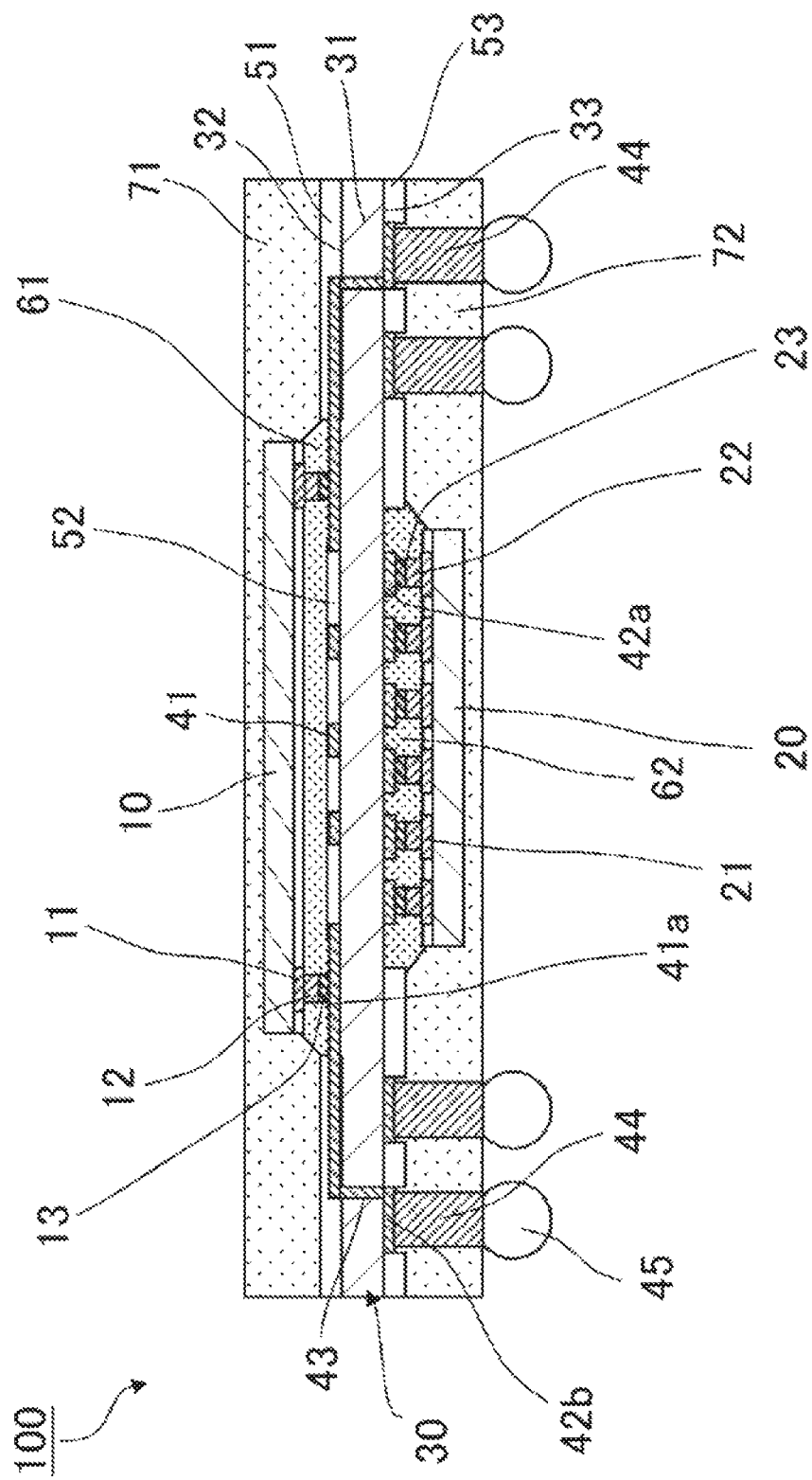
FIG. 1 is a cross-sectional view showing a configuration of a semiconductor device 100 according to a first embodiment of the present invention.
Figure 2:
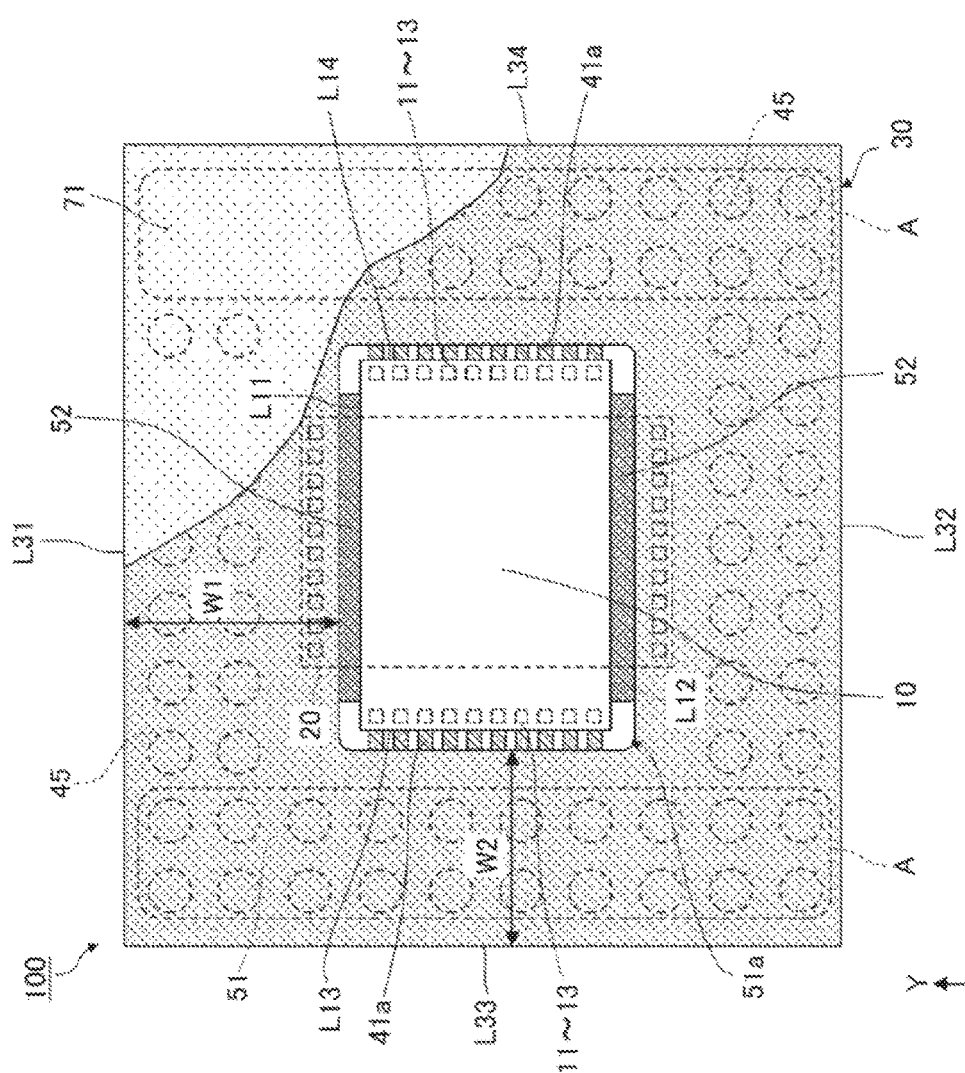
FIG. 2 is a schematic plan view showing the semiconductor device 100 from a top-surface direction.
Figure 3:
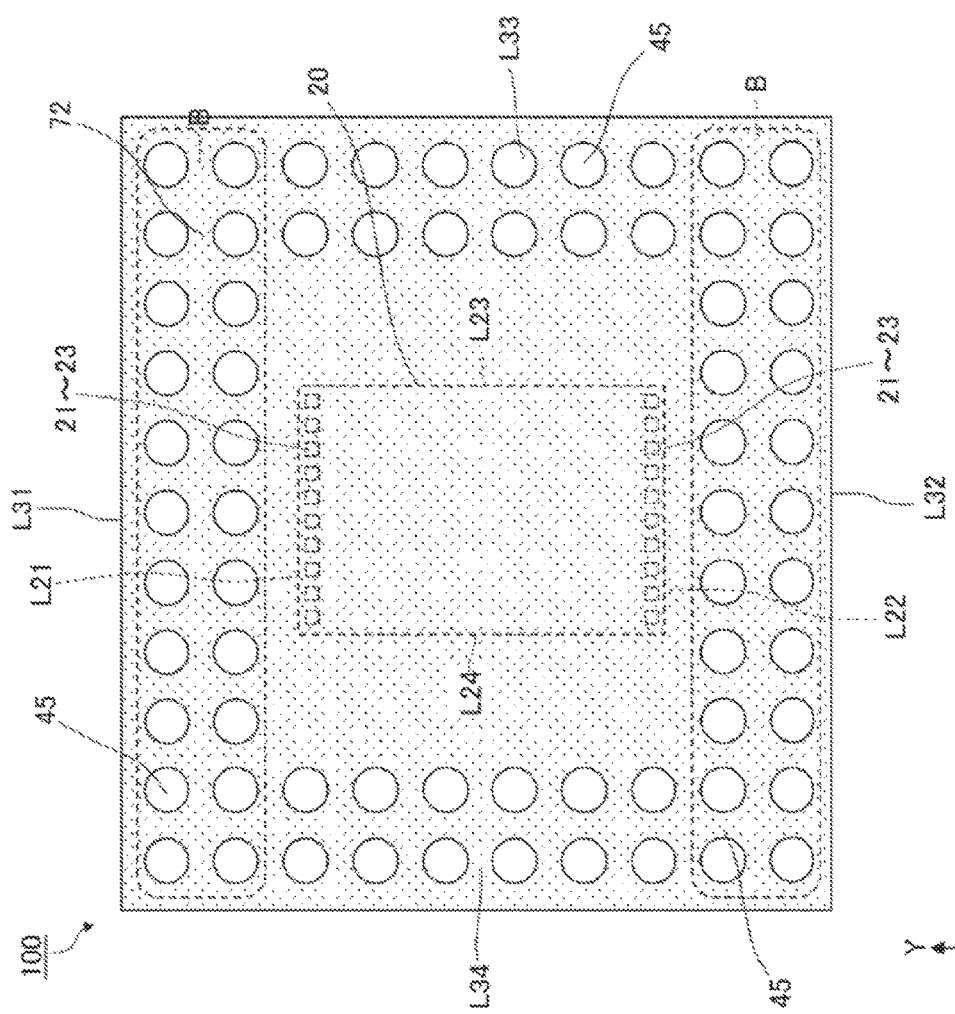
FIG. 3 is a schematic plan view showing the semiconductor device 100 from a back-surface direction.
Figure 4:
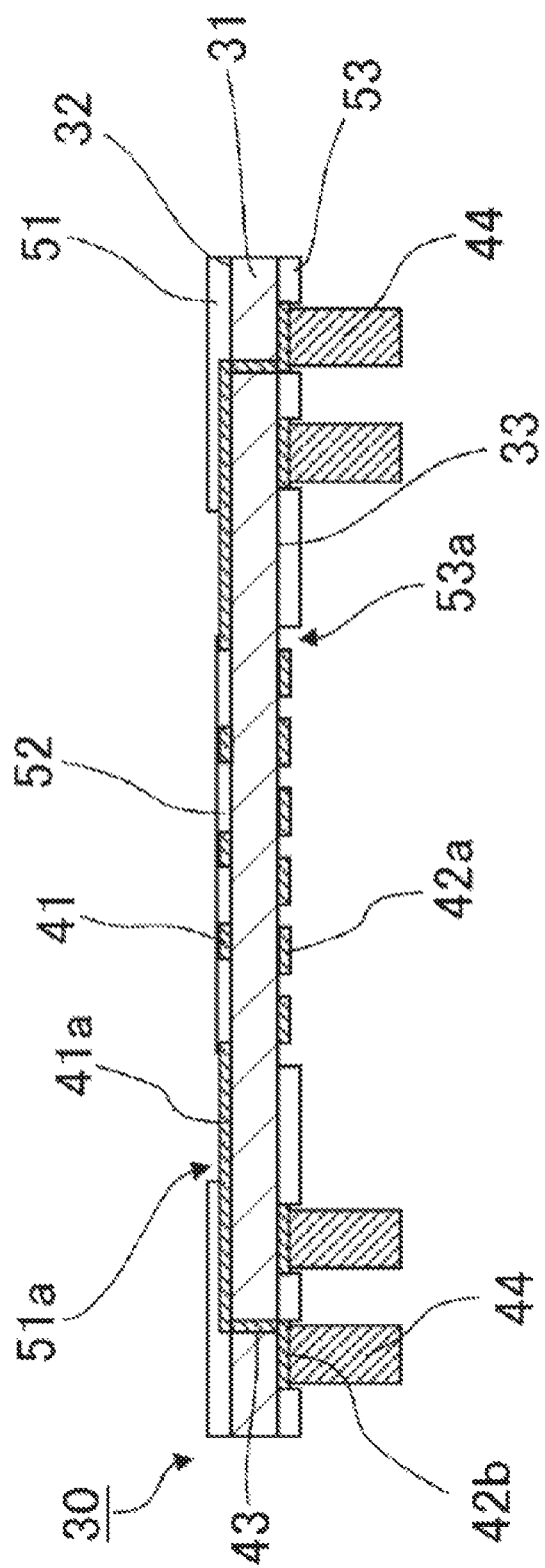
FIG. 4 is a cross-sectional view showing a substrate 30 extracted from the semiconductor device 100.
Figure 5:
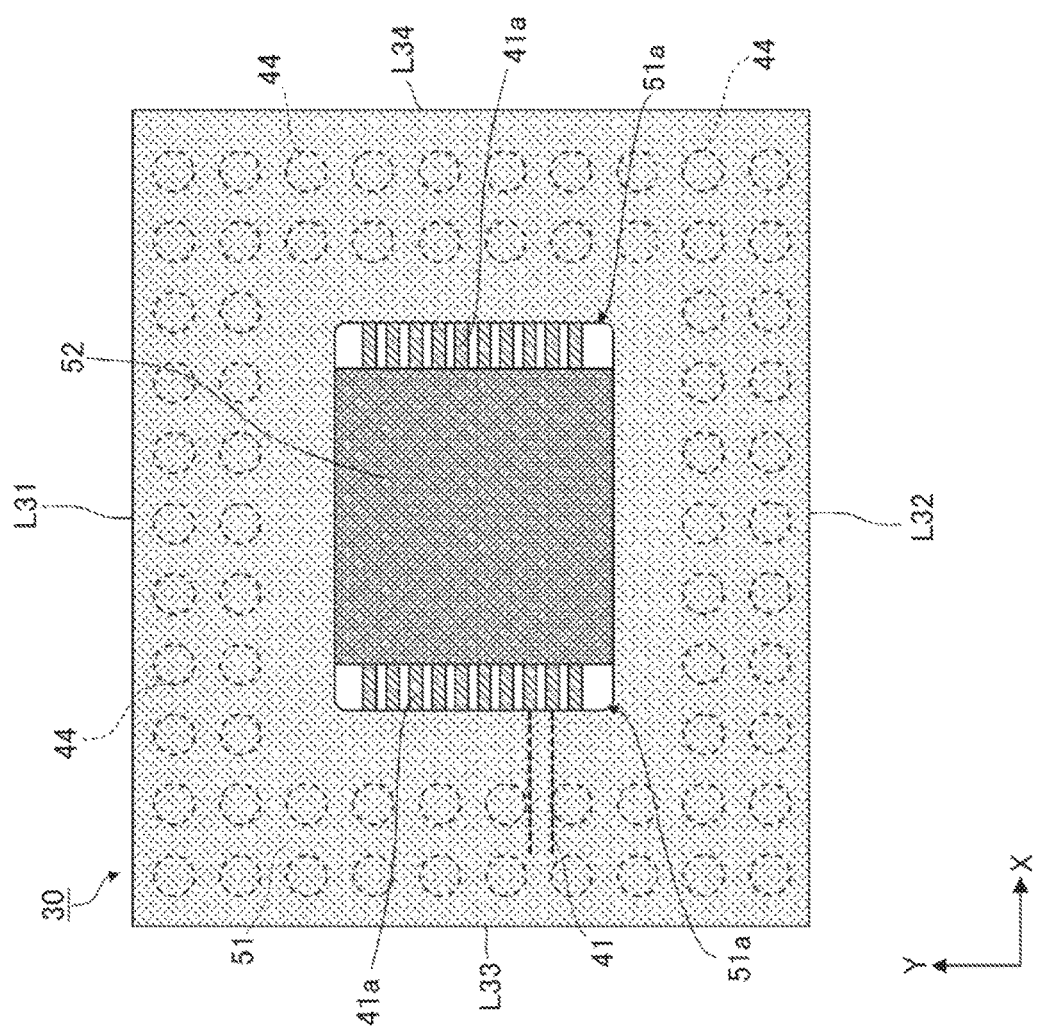
FIG. 5 is a schematic plan view showing the substrate 30 from the top-surface direction.
Figure 6:
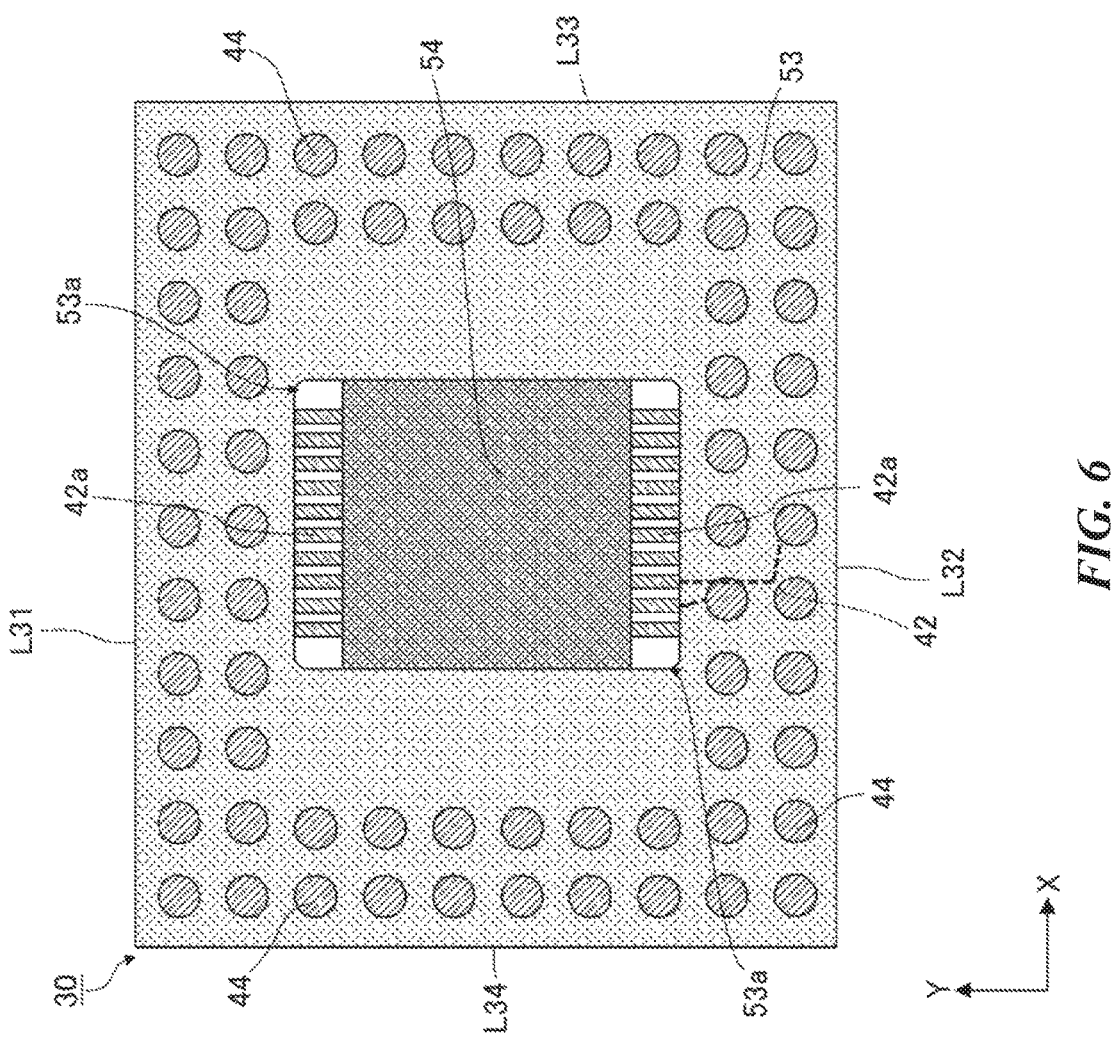
FIG. 6 is a schematic plan view showing the substrate 30 from the back-surface direction.

FIG. 1 is a cross-sectional view showing a configuration of a semiconductor device 100 according to a first embodiment of the present invention, and FIG. 2 and FIG. 3 are schematic plan views showing the semiconductor device 100 from a top-surface direction and a back-surface direction, respectively. FIG. 4 is a cross-sectional view showing a wiring substrate 30 extracted from the semiconductor device 100, and FIG. 5 and FIG. 6 are schematic plan views showing the wiring substrate 30 from the top-surface direction and the back-surface direction, respectively.

As shown FIG. 1 to FIG. 3, the semiconductor device 100 according to the present embodiment is provided with the wiring substrate 30 and two semiconductor chips 10 and 20, which are flip-chip bonded respectively on both surfaces of the wiring substrate. The semiconductor chips 10 and 20 are not particularly limited, but are DRAMs (Dynamic Random Access Memories) in the present embodiment and have identical circuit configurations and identical pad layouts. However, the present invention is not limited thereto, the semiconductor chips 10 and 20 may be memory chips of other types such as flash memories; or one of the semiconductor chips 10 and 20 may be a memory chip, and the other one may be a control chip which controls that.

As shown in FIG. 2, the planar shape of the semiconductor chip 10 is a rectangular shape having long sides L11 and L12 in an X direction and short sides L13 and L14 in a Y direction, and, on a first surface thereof, a plurality of pad electrodes 11 are arranged in the Y direction along both of the short sides L13 and L14. The sides L11 to L14 of the semiconductor chip 10 are ends which define the first surface of the semiconductor chip 10 and are opposed to sides L31 to L34 of the wiring substrate 30, respectively. A plurality of first bump electrodes 12, which are projecting from the first surface of the semiconductor chip 10, are provided on the pad electrodes 11. The bump electrodes 12 are composed of a metal material such as copper, and a solder layer 13 is formed on the distal ends thereof.

As shown in FIG. 3, the planar shape of the semiconductor chip 20 is a rectangular shape having short sides L21 and L22 in the X direction and long sides L23 and L24 in the Y direction, and, on a first surface thereof, a plurality of pad electrodes 21 are arranged in the X direction along both of the short sides L21 and L22. The sides L21 to L24 of the semiconductor chip 20 are ends which define the first surface of the semiconductor chip 20 and are opposed to the sides L31 to L34 of the wiring substrate 30, respectively. A plurality of second bump electrodes 22, which are projecting from the first surface of the semiconductor chip 20, are provided on the pad electrodes 21. The bump electrodes 22 are composed of a metal material such as copper, and a solder layer 23 is formed on the distal ends thereof.

As shown in FIG. 2, the planar shape of the wiring substrate 30 is a rectangular shape, which is long in the X direction, the semiconductor chip 10 is mounted so that the longitudinal direction of the semiconductor chip 10 is parallel to the longitudinal direction of the wiring substrate 30, and the semiconductor chip 20 is mounted so that the longitudinal direction of the semiconductor chip 20 is perpendicular to the longitudinal direction of the wiring substrate 30. The planar shapes of the wiring substrate 30 and the semiconductor chips 10 and 20 are not required to be complete rectangular shapes, but are only required to be substantially rectangular shapes. Therefore, examples of the shapes also include the shape provided with chamfers at corners and the shape provided with a cutout at part of each side.

In this manner, the semiconductor chips 10 and 20 have edge-pad structures in which the bump electrodes 12 and 22 are formed along the short sides and are mounted on the wiring substrate 30 in a state in which they are mutually rotated by 90°. More specifically, the long sides L11 and L12 of the semiconductor chip 10 and the short sides L21 and L22 of the semiconductor chip 20 are disposed to be parallel to each other, and the short sides L13 and L14 of the semiconductor chip 10 and the long sides L23 and L24 of the semiconductor chip 20 are disposed to be parallel to each other. Therefore, the bump electrodes 12 of the semiconductor chip 10 are positioned at the parts which are different from the mounted position of the semiconductor chip 20 in terms of a plane, and the bump electrodes 22 of the semiconductor chip 20 are positioned at the parts which are different from the mounted position of the semiconductor chip 10 in terms of the plane.

The wiring substrate 30 uses, as a base, a rigid insulating base material 31, which is a core material such as a glass cloth impregnated with, for example, an epoxy resin, the semiconductor chip 10 is flip-chip bonded on a first surface 32 thereof, and the semiconductor chip 20 is flip-chip bonded on a second surface 33 thereof. The thickness of the insulating base material 31 is not particularly limited, but may be about 90 µm. On the first surface 32 of the insulating base material 31, a plurality of wiring patterns 41 and first and second insulating films 51 and 52 covering them are provided. Similarly, on the second surface 33 of the insulating base material 31, a plurality of wiring patterns 42 and third and fourth insulating films 53 and 54 covering them are provided. So-called solder resist can be used as the insulating films 51 to 54. The film thickness of the insulating film 52 is not particularly limited, but is preferred to be thinner than that of the insulating film 51; and, similarly, the film thickness of the insulating film 54 is preferred to be thinner than that of the insulating film 53.

As shown in FIG. 5, part of the wiring patterns 41 has a plurality of first connection pads 41a, which are exposed from the insulating films 51 and 52, and the bump electrodes 12 of the semiconductor chip 10 are joined with the connection pads 41a via the solder layer 13. The insulating film 51 is formed in an outer-peripheral region of the first surface 32 of the insulating base material 31, and an opening 51a in which the insulating film 51 is not formed is provided in a central region. The insulating film 52 is formed in the opening 51a so that the connection pads 41a are exposed. As shown in FIG. 2, the semiconductor chip 10 is mounted in the opening 51a so that the bump electrodes 12 are joined with the connection pads 41a.

The gap between the semiconductor chip 10 and the insulating film 52 is filled with an underfill material 61 (resin filler). Herein, if the film thickness of the insulating film 52 is set to be thin, space can be reliably ensured between the semiconductor chip 10 and the insulating film 52, and deficient connection, etc. due to interference between the semiconductor chip 10 and the insulating film 52 can be prevented. Moreover, since the first surface 32 of the insulating base material 31 having asperities generated by the presence of the wiring patterns 41 is planarized by the insulating film 52, fluidity of filling of the underfill material 61 can be also ensured. Furthermore, if the film thickness of the insulating film 51 is set to be thicker than the insulating film 52, the rigidity of the wiring substrate 30 is increased, and, therefore, handling thereof becomes easy.

Similarly, as shown in FIG. 6, part of the wiring patterns 42 has a plurality of connection pads 42a, which are exposed from the insulating films 53 and 54, and the bump electrodes 22 of the semiconductor chip 20 are joined with the connection pads 42a via the solder layer 23. The insulating film 53 is formed in an outer-peripheral region of the second surface 33 of the insulating base material 31, and an opening 53a in which the insulating film 53 is not formed is provided in a central region. The insulating film 54 is formed in the opening 53a so that the connection pads 42a are exposed. The semiconductor chip 20 is mounted in the opening 53a so that the bump electrodes 22 are joined with the connection pads 42a.

The gap between the semiconductor chip 20 and the insulating film 54 is filled with an underfill material 62 (resin filler). Herein, if the film thickness of the insulating film 54 is set to be thin, space can be reliably ensured between the semiconductor chip 20 and the insulating film 54, and deficient connection, etc. due to interference between the semiconductor chip 20 and the insulating film 54 can be prevented. Moreover, since the second surface 33 of the insulating base material 31 having asperities generated by the presence of the wiring patterns 42 is planarized by the insulating film 54, fluidity of filling of the underfill material 62 can be also ensured. Furthermore, if the film thickness of the insulating film 53 is set to be thicker than the insulating film 54, the rigidity of the wiring substrate 30 is increased, and, therefore, handling thereof becomes easy.

The first surface 32 of the insulating base material 31 is sealed with a first sealing resin 71 so as to cover the back surface and lateral surfaces of the semiconductor chip 10. Similarly, the second surface 33 of the insulating base material 31 is sealed with a second sealing resin 72 so as to cover the back surface and lateral surfaces of the semiconductor chip 20. The sealing resins 71 and 72 are not particularly limited, but are formed of, for example, a thermosetting epoxy resin.

Furthermore, a plurality of lands 42b, which are electrically connected to the connection pads 41a or 42a, are provided on the second surface 33 of the insulating base material 31. The lands 42b are part of the wiring patterns 42 and consist comprise the part exposed from the insulating film 53. The lands 42b and the connection pads 41a are connected to each other via through-hole conductors 43, which are provided to penetrate through the insulating base material 31. The lands 42b are not particularly limited, but are arranged in two rows along the sides L31 to L34 of the wiring substrate 30 so as to surround the connection pads 42a.

As shown in FIG. 1, a plurality of conductive posts 44, which are provided to penetrate through a sealing resin 72 and are composed of, for example, copper, are provided on the lands 42b, respectively. Therefore, a first end of each of the conductive posts 44 is connected to the corresponding land 42b, and a second end of the conductive post 44 is in a state in which the second end is exposed from the sealing resin 72. The second end of the conductive post 44 constitutes the same plane as that of the surface of the sealing resin 72. A solder ball 45, which is an external electrode, is mounted on the second end of the conductive post 44.

By virtue of such a configuration, both of the bump electrodes 12 and 22 of the semiconductor chips 10 and 20 are electrically connected to the solder balls 45 via the conductive posts 44. The solder balls 45 are the terminals for connecting the semiconductor device 100 according to the present embodiment to an external device; and, in a case in which the semiconductor device 100 according to the present embodiment is directly mounted on, for example, a motherboard or a module substrate, the solder balls 45 are connected to lands which are provided on the motherboard or the module substrate. In a case in which a semiconductor device having a PoP (Package on Package) structure is formed by using the semiconductor device 100 according to the present embodiment, the solder balls 45 are connected on lands 81 which are provided on a top surface of another package 80 as shown in FIG. 7.

Figure 7:
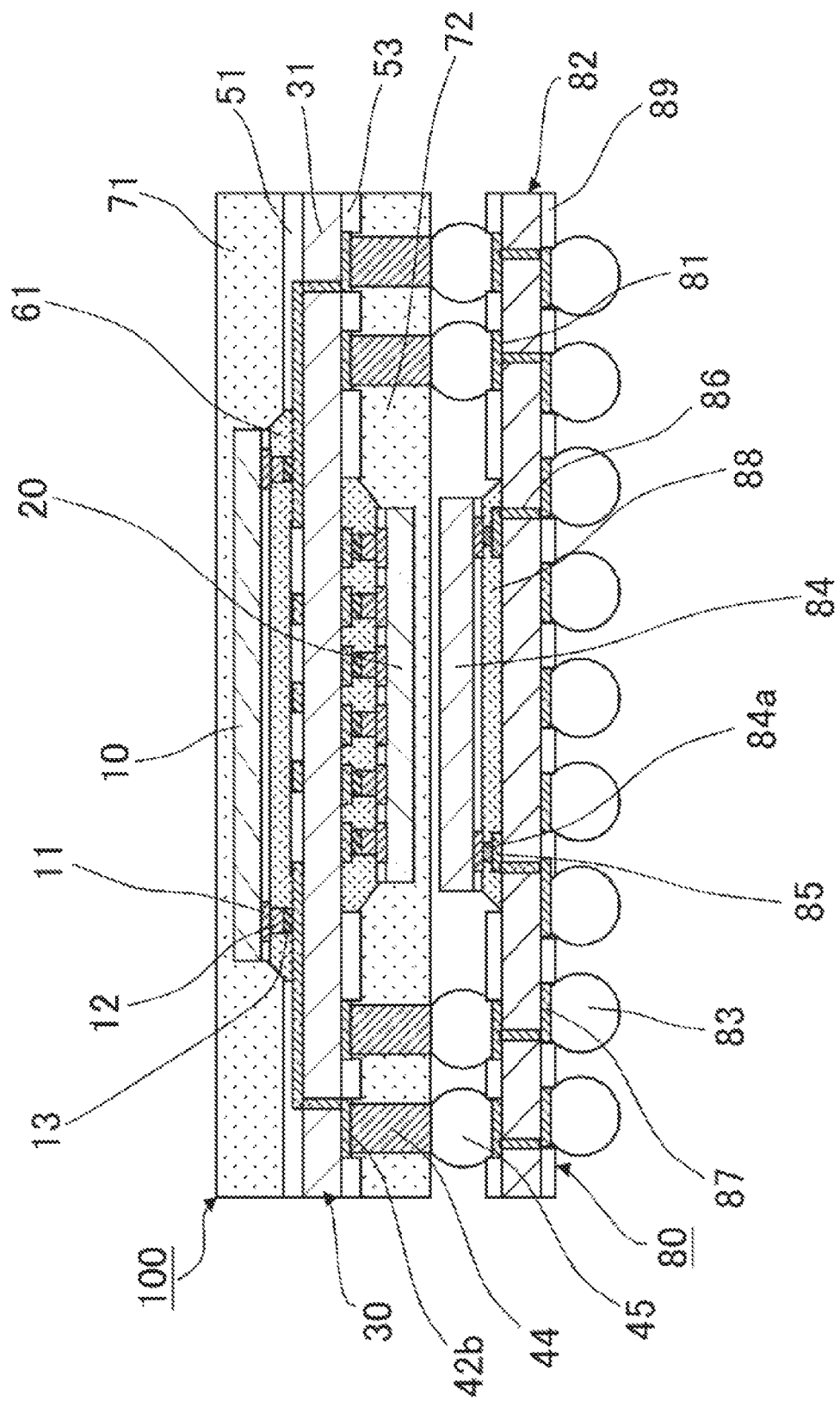
FIG. 7 is a cross-sectional view showing a configuration of a semiconductor device having a PoP structure using the semiconductor device 100.

The package 80 shown in FIG. 7 is a package using a rigid substrate 82, and the surface thereof is covered with an insulating film 89, which is composed of solder resist. A semiconductor chip 84 is flip-chip bonded on a first surface of the wiring substrate 82, and solder balls 83 are provided on a second surface of the wiring substrate 82. The lands 81 are provided on the first surface of the wiring substrate 82, and the solder balls 45 of the semiconductor device 100 according to the present embodiment are connected to the lands 81.

Each of bump electrodes 84a of the semiconductor chip 84 is connected to a connection pad 85, is connected to the land 81 via an unshown wiring pattern, and is connected to the solder ball 83 via a through-hole conductor 86 and a land 87. The space between the semiconductor chip 84 and the wiring substrate 82 is filled with an underfill material 88.

In the semiconductor device having the PoP structure shown in FIG. 7, since the second semiconductor chip 84, etc. are provided on the surface of the package 80, asperities are present on the surface on which the semiconductor device 100 is to be mounted. In a case in which the semiconductor device 100 is mounted on the surface on which such asperities are present, the difference in the height between the surface of the sealing resin 72 and the distal ends of the solder balls 45, so-called standoff has to be sufficiently ensured. In the semiconductor device 100 according to the present embodiment, the second ends of the conductive posts 44 and the surface of the sealing resin 72 form the same plane, and the solder balls 45 are provided on the second ends of the conductive posts 44; therefore, a sufficient standoff can be ensured. By virtue of this, the PoP structure as shown in FIG. 7 can be easily obtained.

Moreover, since the size of the solder balls 45 is not required to be increased in order to expand the standoff like a semiconductor device described in Japanese Patent Application Laid-Open No. 2006-210566, the many solder balls 45 can be arranged in a narrow pitch. Furthermore, since the conductive posts 44 are not projected like a semiconductor device described in Japanese Patent Application Laid-Open No. 2007-287906, the standoff does not become excessive.

Moreover, in the present embodiment, the long sides of the semiconductor chip 10, which is flip-chip bonded on the first surface 32 of the wiring substrate 30 and has the substantially rectangular shape, are parallel to the long sides of the wiring substrate 30. Therefore, compared with a case in which the long sides of the semiconductor chip 10 are parallel to the short sides of the wiring substrate 30, the difference between the distance W1 from the long side of the semiconductor chip 10 to the corresponding long side of the wiring substrate and the distance W2 from the short side of the semiconductor chip 10 to the corresponding short side of the wiring substrate can be reduced (see FIG. 2). By virtue of this, the difference in the amounts of the first sealing resin 71 in the long-side direction and the short-side direction of the wiring substrate 30 is reduced, and the warpage of the semiconductor device in a minus direction due to, for example, hardening shrinkage of the first sealing resin 71 can be reduced and shifted to a plus direction.

Moreover, in the semiconductor device 100 according to the present embodiment, the first surface 32 of the wiring substrate 30 is covered with the sealing resin 71, and the second surface 33 is covered with the sealing resin 72; therefore, the top/bottom structures viewed from the wiring substrate 30 are approximately symmetrical. By virtue of this, an effect that warpage of the semiconductor device 100 due to temperature changes is not easily caused can be also obtained.

Furthermore, in the present embodiment, the semiconductor chips 10 and 20 are mounted to be shifted from each other by 90° on the substrate 30; therefore, the bump electrodes 12 of the semiconductor chip 10 can be connected to the solder balls 45 in regions A shown in FIG. 2 by short distances, and the bump electrodes 22 of the semiconductor chip 20 can be connected to the solder balls 45 in regions B shown in FIG. 3 by short distances. By virtue of this, the wiring distances of connecting the semiconductor chip 10 and the solder balls 45 and the wiring distances of connecting the semiconductor chip 20 and the solder balls 45 can be caused to be approximately equal distances; therefore, high signal quality can be obtained. Moreover, wiring patterns are not concentrated on particular parts on the wiring substrate 30; therefore, the degree of freedom of a layout can be increased, and a manufacturing yield can be also increased.

Next, a manufacturing method of the semiconductor device 100 according to the present embodiment will be explained.

FIG. 8 to FIG. 15 are process drawings for explaining the manufacturing method of the semiconductor device 100 according to the present embodiment.

Figure 8:
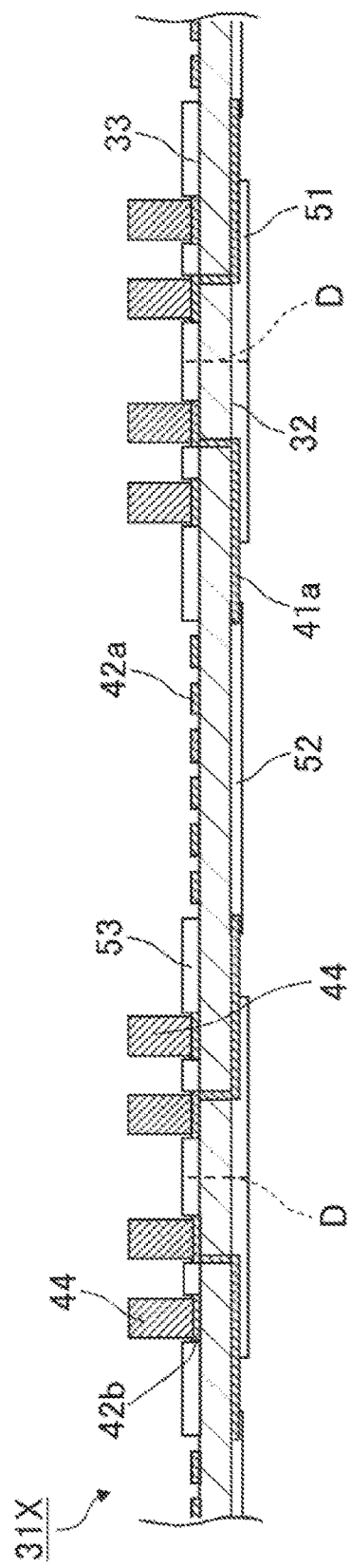
FIG. 8 is a process drawing for explaining a manufacturing method of the semiconductor device 100.

First, as shown in FIG. 8, a base 31X of the insulating base material 31 having the wiring patterns 41 and the insulating films 51 and 52 provided on the first surface 32 and having the wiring patterns 42 and the insulating film 53 (and the unshown insulating film 54) provided on the second surface 33 is prepared. Symbols D denoted on the base 31X represent dicing lines. As described above, since the insulating base material 31 is a rigid substrate, which comprises a core material such as a glass cloth impregnated with, for example, an epoxy resin, the insulating base material 31 can be handled without using, for example, another supporting substrate. The opening which exposes the connection pads 41a, which are part of the wiring patterns 41, is formed in the insulating films 51 and 52, and the opening which exposes the connection pads 42a, which are part of the wiring patterns 42, and the lands 42b is formed in the insulating films 53 and 54.

Then, the plurality of conductive posts 44 connected to the lands 42b are formed. A method of forming the conductive posts 44 is not particularly limited, but an electrolytic plating method is preferred to be used. As an example, after a thick resist mask is formed on the insulating films 53 and 54, the lands 42b are exposed by forming through holes at the parts corresponding to the lands 42b, and the conductive posts 44 can be formed by subjecting the exposed lands 42b to electrolytic plating.

Figure 9:
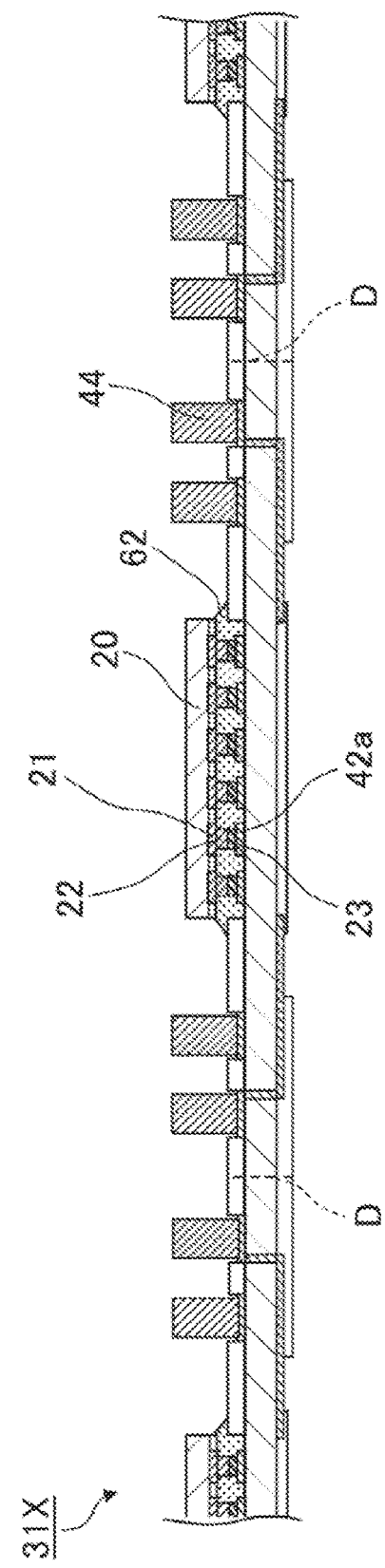
FIG. 9 is a process drawing for explaining the manufacturing method of the semiconductor device 100.

Then, as shown in FIG. 9, the semiconductor chip 20 is flip-chip bonded on the second surface 33 of the insulating base material 31 so that the connection pads 42a and the bump electrodes 22 are joined with each other. However, if projecting parts are provided on the connection pads 42a, the bump electrodes 22 are not required to be formed on the semiconductor chip 20. After the semiconductor chip 20 is bonded, the underfill material 62 is supplied to the gap between a main surface of the semiconductor chip 20 and the insulating film 54 to seal the gap. Note that NCF (Non-Conductive Film) or NCP (Non-Conductive Paste) may be used instead of the underfill material 62.

Then, as shown in FIG. 10, the second surface of the wiring substrate 30 is sealed with the sealing resin 72 so that the semiconductor chip 20 and the conductive posts 44 are buried.

Then, as shown in FIG. 11, the semiconductor chip 10 is flip-chip bonded on the first surface 32 of the insulating base material 31 so that the connection pads 41a and the bump electrodes 12 are joined with each other. However, if projecting parts are provided on the connection pads 41a, the bump electrodes 12 are not required to be formed on the semiconductor chip 10. After the semiconductor chip 10 is bonded, the underfill material 61 is supplied to the gap between a main surface of the semiconductor chip 10 and the insulating film 52 to seal the gap. Also in this case, NCF or NCP may be used instead of the underfill material 61.

Figure 16A:
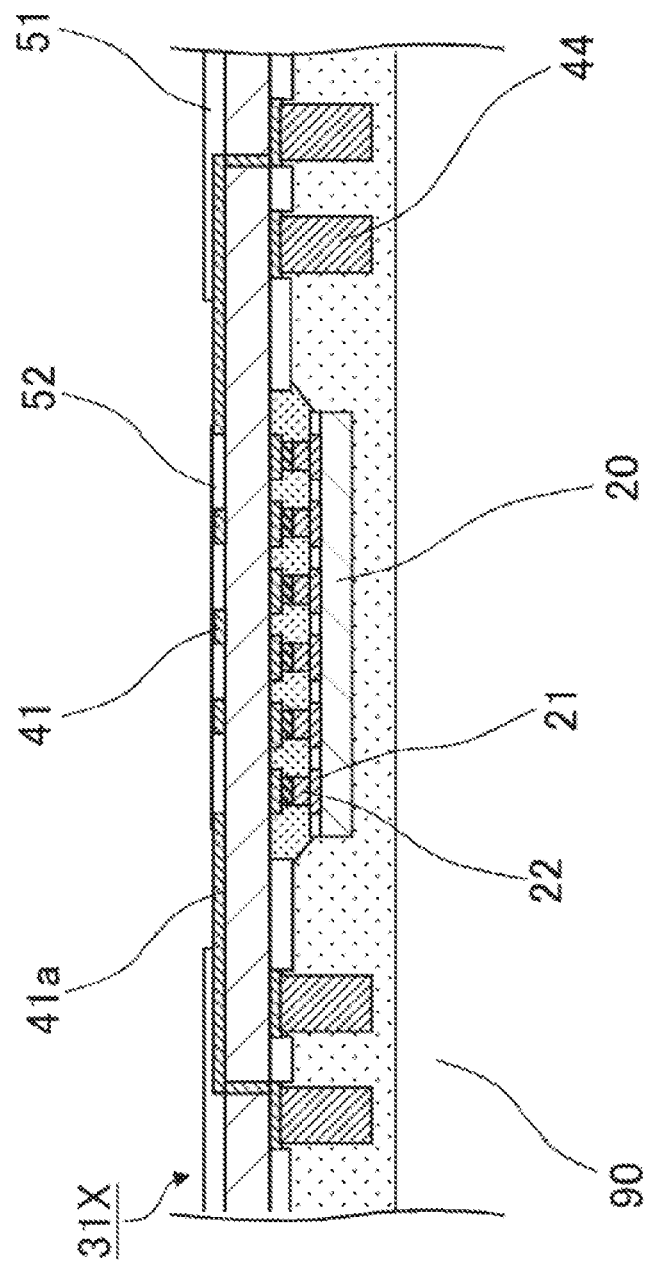
FIGS. 16A to 16C are process drawings for explaining a method of flip-chip mounting a semiconductor chip 10 on a first surface 32 of an insulating base material 31.
Figure 16B:
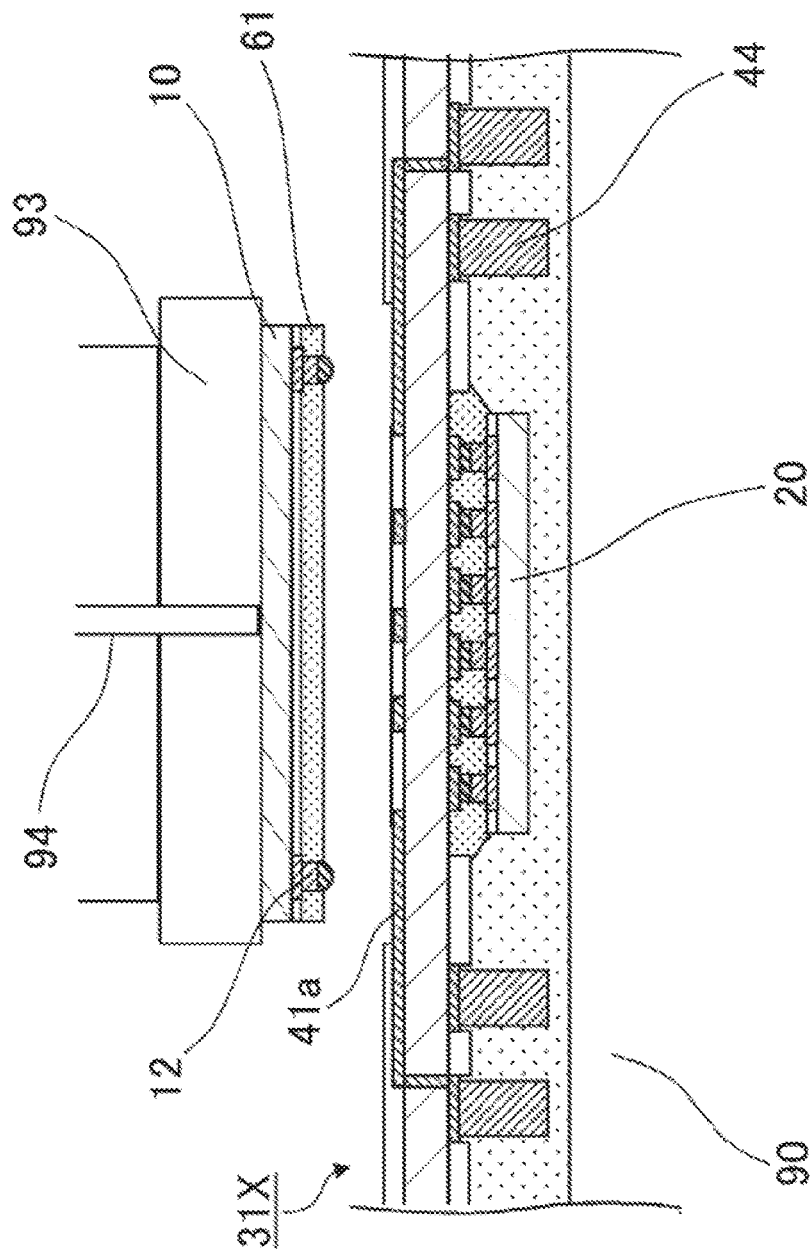
Figure 16C:
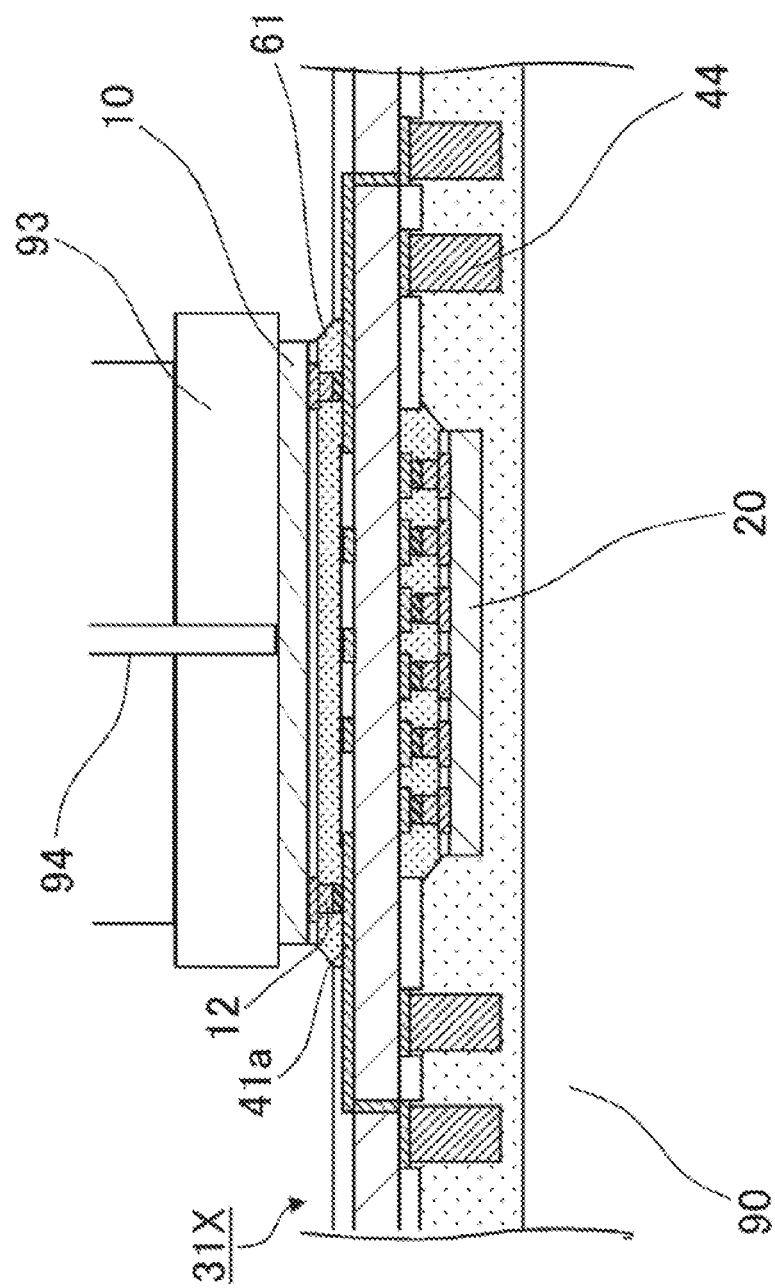

FIGS. 16A to 16C are drawings for explaining a method of flip-chip bonding the semiconductor chip 10 on the first surface 32 of the insulating base material 31.

First, as shown in FIG. 16A, the insulating base material 31 on which the semiconductor chip 20 is mounted and the sealing resin 72 is further formed is placed on a stage 90. Since the shapes of the asperities of the second surface 33 of the insulating base material 31 caused by the semiconductor chip 20 and the conductive posts 44 are covered with and planarized by the sealing resin 72, the mounted surface of the stage 90 is only required to be a flat surface that is able to entirely contact the flat surface of the sealing resin 72. Then, as shown in FIG. 16B, the semiconductor chip 10 is picked up from the back surface side by a bonding tool 93, and the bump electrodes 12 of the semiconductor chip 10 are positioned with respect to the connection pads 41a on the insulating base material 31. The bonding tool 93 is provided with a suction nozzle 94 for sucking the semiconductor chip 10, and, by virtue of that, the semiconductor chip 10 can be retained from the back surface side. In the present example, at this point of time, NCF (61) is pasted on the first surface of the semiconductor chip 10.

Then, as shown in FIG. 16C, the bump electrodes 12 of the semiconductor chip 10 are brought into contact with the connection pads 41a by lowering the bonding tool 93, and, in this state, the bump electrodes 12 and the connection pads 41a are joined with each other by applying load and ultrasonic waves. In this process, the load applied to the wiring substrate 30 concentrates on the positions corresponding to the bump electrodes 12 of the semiconductor chip 10. However, in the present embodiment, the back surface at the positions on which the load concentrates, in other words, the positions corresponding to the bump electrodes 12 is supported by the stage 90; therefore, deformation of the wiring substrate 30 and breakage of the semiconductor chip 20 on the back surface thereof by application of the load is prevented. This is for a reason that the planar shapes of the semiconductor chips 10 and 20 are rectangular shapes, the bump electrodes 12 and 22 are disposed along the short sides thereof, and the mounting directions of the semiconductor chip 10 and the semiconductor chip 20 are mutually different by 90°. By virtue of this, the semiconductor chip 10 can be mounted under good conditions; therefore, reliability of the semiconductor device 100 can be increased.

Figure 12:
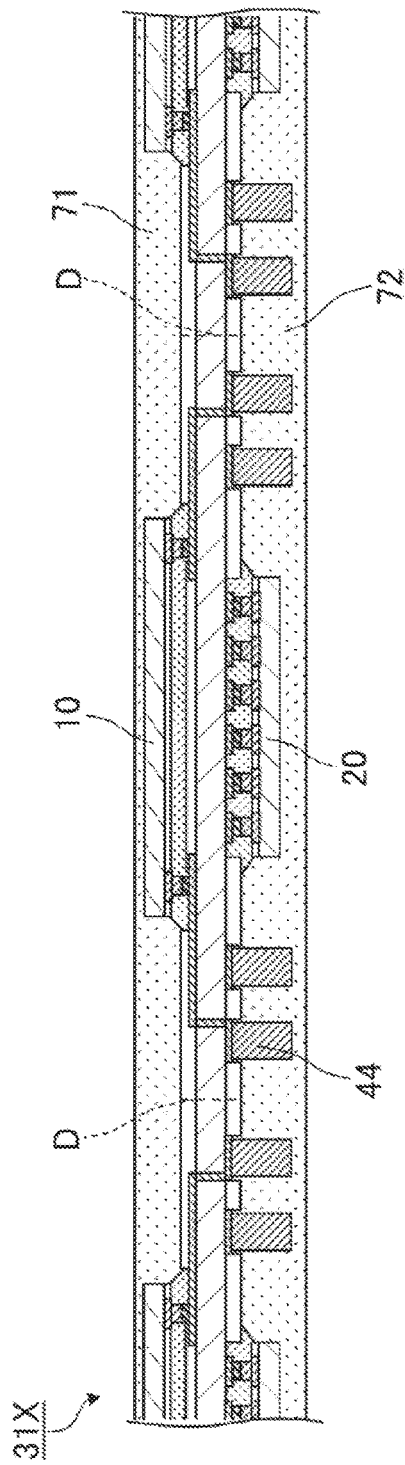
FIG. 12 is a process drawing for explaining the manufacturing method of the semiconductor device 100.

Then, as shown in FIG. 12, the first surface of the wiring substrate 30 is sealed with the sealing resin 71 so that the semiconductor chip 10 is buried. The formation of the sealing resin 71 can be carried out in a manner similar to the formation of the sealing resin 72.

Figure 13:
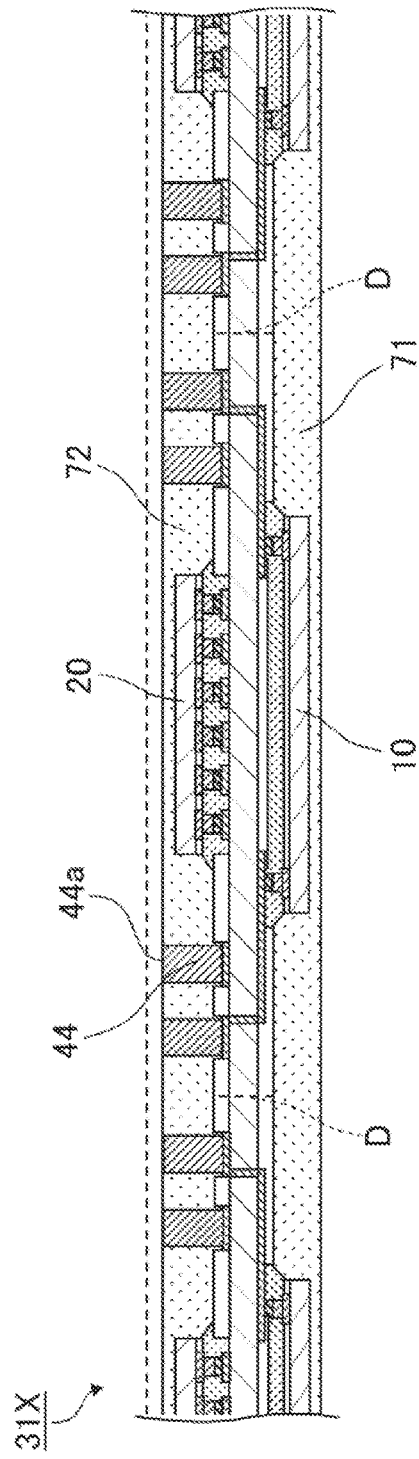
FIG. 13 is a process drawing for explaining the manufacturing method of the semiconductor device 100.

Then, as shown in FIG. 13, the surface of the sealing resin 72 is ground until distal ends 44a of the conductive posts 44 are exposed. By virtue of this, the surfaces of the ends of the conductive posts 44 and the sealing resin 72 form the same plane. In the present embodiment, since the height of the conductive posts 44 is designed to be higher than that of the semiconductor chip 20, the back surface of the semiconductor chip 20 is not contaminated by the grinding dust such as copper generated by grinding of the sealing resin 72.

Then, the solder balls 45 are mounted on the ends of the conductive posts 44 as shown in FIG. 14. Then, as shown in FIG. 15, when separation into an individual piece is carried out by cutting the base 31X and the sealing resins 71 and 72 along the dicing lines D, the semiconductor device 100 according to the present embodiment is completed. Note that, if the solder balls 45 are mounted immediately after the conductive posts 44 are exposed by grinding of the sealing resin 72, deficient connection due to oxidation of the distal ends 44a of the conductive posts 44 can be prevented.

In this manner, in the manufacturing processes of the semiconductor device 100 according to the present embodiment, the sealing resin 72 is ground until the distal ends 44a of the conductive posts 44 are exposed; therefore, the overall thickness thereof can be reduced. Moreover, the semiconductor chips 10 and 20 on which the bump electrodes 12 and 22 are disposed along the short sides are mounted with an angle of 90° with respect to each other; therefore, the semiconductor chips 10 and 20 can be mounted under good conditions without causing the wiring substrate 30 to deform, etc.

Moreover, according to the present embodiment, the stage of a flip-chip bonder, which is used for flip-chip bonding the first semiconductor chip 10 on the first surface 32 of the wiring substrate 30, is not required to be provided with a recessed part for avoiding the second semiconductor chip 20 and the conductive posts 44, and the flip-chip bonder can be shared. Moreover, similarly, a mold, which is used when the first semiconductor chip is sealed with the first sealing resin, is not required to be provided with a recessed part for avoiding the second semiconductor chip 20 and the conductive posts 44, and the mold can be also shared. Therefore, increase in the manufacturing cost of the semiconductor device can be suppressed.

Moreover, according to the present embodiment, the second semiconductor chip 20 is flip-chip bonded on the second surface 33 of the wiring substrate 30, the second sealing resin 72, which seals the second semiconductor chip 20, is formed on the second surface 33 of the wiring substrate 30, and, then, the first semiconductor chip 10 is flip-chip bonded on the first surface 32 of the wiring substrate 30. Therefore, the thin substrate 30 is not deflected when the first semiconductor chip 10 is flip-chip bonded, and application of load and ultrasonic waves to the bump electrodes by the bonding tool can be improved. Therefore, the connectivity between the connection pads of the wiring substrate and the respective bump electrodes of the semiconductor chip can be improved, and, by virtue of that, reliability of the semiconductor device can be improved.

Furthermore, in the present embodiment, when the conductive posts 44 are exposed by grinding the second sealing resin 72, the first semiconductor chip 10 is covered with the first sealing resin 71, and the second sealing resin 72 is also covered with the second semiconductor chip 20; therefore, the back surfaces of the semiconductor chips are not contaminated by the grinding dust (for example, copper) of the conductive posts. Moreover, deficient connection caused by oxidation of the exposed surfaces of the conductive posts can be suppressed by mounting the solder balls immediately after the conductive posts are exposed.

Moreover, according to the present embodiment, the sealing resins 71 and 72 are formed in mutually different processes; therefore, mutually different materials can be selected. For example, since the conductive posts 44 are present on the second surface 33 of the substrate 30, if the materials of the sealing resins 71 and 72 are the same, the hardening shrinkage of the sealing resin 71 becomes larger than the hardening shrinkage of the sealing resin 72, and the substrate 30 may be warped. When a material having a larger coefficient of linear expansion than that of the material of the sealing resin 71 is selected as the material of the sealing resin 72 in consideration of this point, warpage of the wiring substrate 30 caused along with hardening shrinkage can be suppressed.

Figure 17:
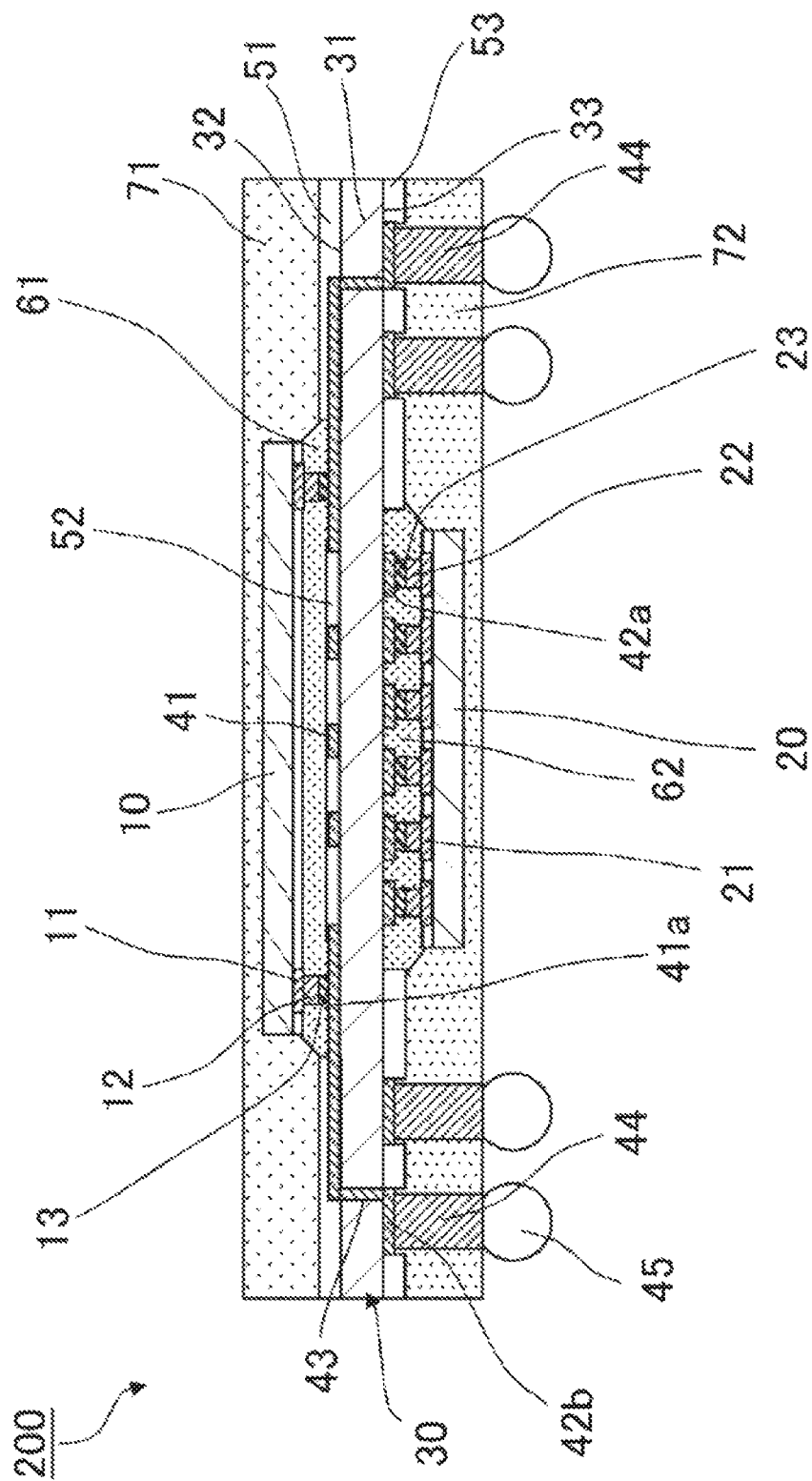
FIG. 17 is a cross-sectional view showing a configuration of a semiconductor device 200 according to a second embodiment of the present invention.

FIG. 17 is a cross-sectional view showing a configuration of a semiconductor device 200 according to a second embodiment of the present invention.

As shown in FIG. 17, a characteristic of the semiconductor device 200 according to the present embodiment resides in a point that the coefficient of linear expansion or the shrinkage ratio of the second sealing resin 72, which is formed on the second surface 33 of the wiring substrate 30, is larger than the coefficient of linear expansion or the shrinkage ratio of the first sealing resin 71, which is formed on the first surface 32. Other configurations are similar to those of the semiconductor device 100 according to the first embodiment.

According to the present embodiment, minus warpage of the semiconductor device 200 can be reduced. Moreover, since the coefficient of linear expansion of the second sealing resin 72 is larger than the coefficient of linear expansion of the first sealing resin 71, warpage of the semiconductor device 200 in a high-temperature area can be changed to minus warpage. Therefore, warpage behavior caused by high temperatures in reflow can be caused to be minus warpage and can be coordinated with behavior of the package in the lower side of PoP, and reliability of PoP can be improved.

Figure 18:
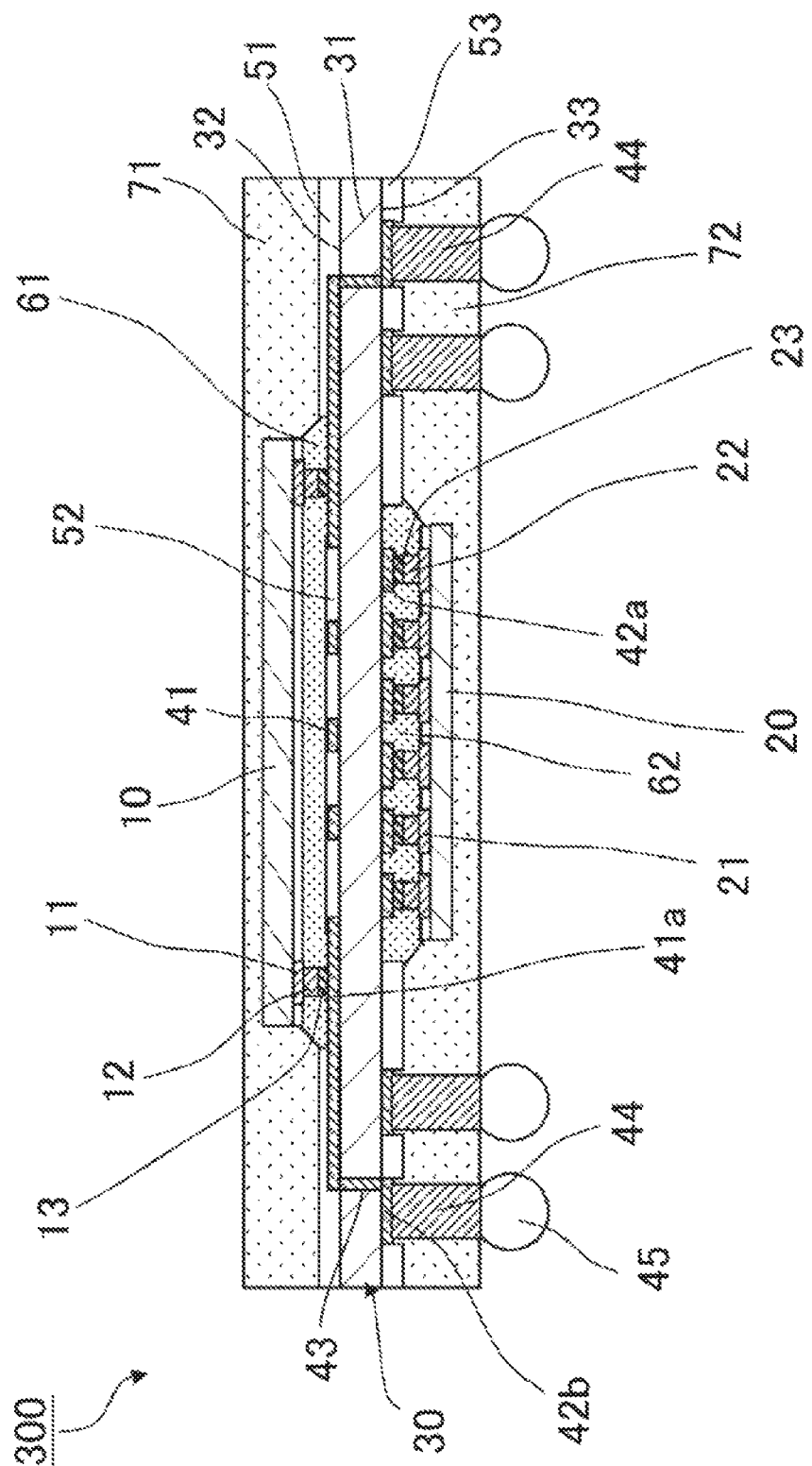
FIG. 18 is a cross-sectional view showing a configuration of a semiconductor device 300 according to a third embodiment of the present invention.

FIG. 18 is a cross-sectional view showing a configuration of a semiconductor device 300 according to a third embodiment of the present invention.

As shown in FIG. 18, a characteristic of the semiconductor device 300 according to the present embodiment resides in a point that the thickness of the second semiconductor chip 20, which is mounted on the second surface 33 of the wiring substrate 30, is thinner than the thickness of the first semiconductor chip 10, which is mounted on the first surface 32 of the wiring substrate 30. Other configurations are similar to those of the semiconductor device 100 according to the first embodiment.

Also in the present embodiment, effects similar to those of the first embodiment can be obtained, the amount of the second sealing resin 72 is increased since the thickness of the second semiconductor chip 20 is thin, and minus warpage of the semiconductor device can be shifted to the direction of plus warpage. In the present embodiment, the semiconductor chip 20 is thin in order to reduce the thickness of the semiconductor device 300. However, the thickness of the semiconductor chip 10 may be increased.

Figure 19:
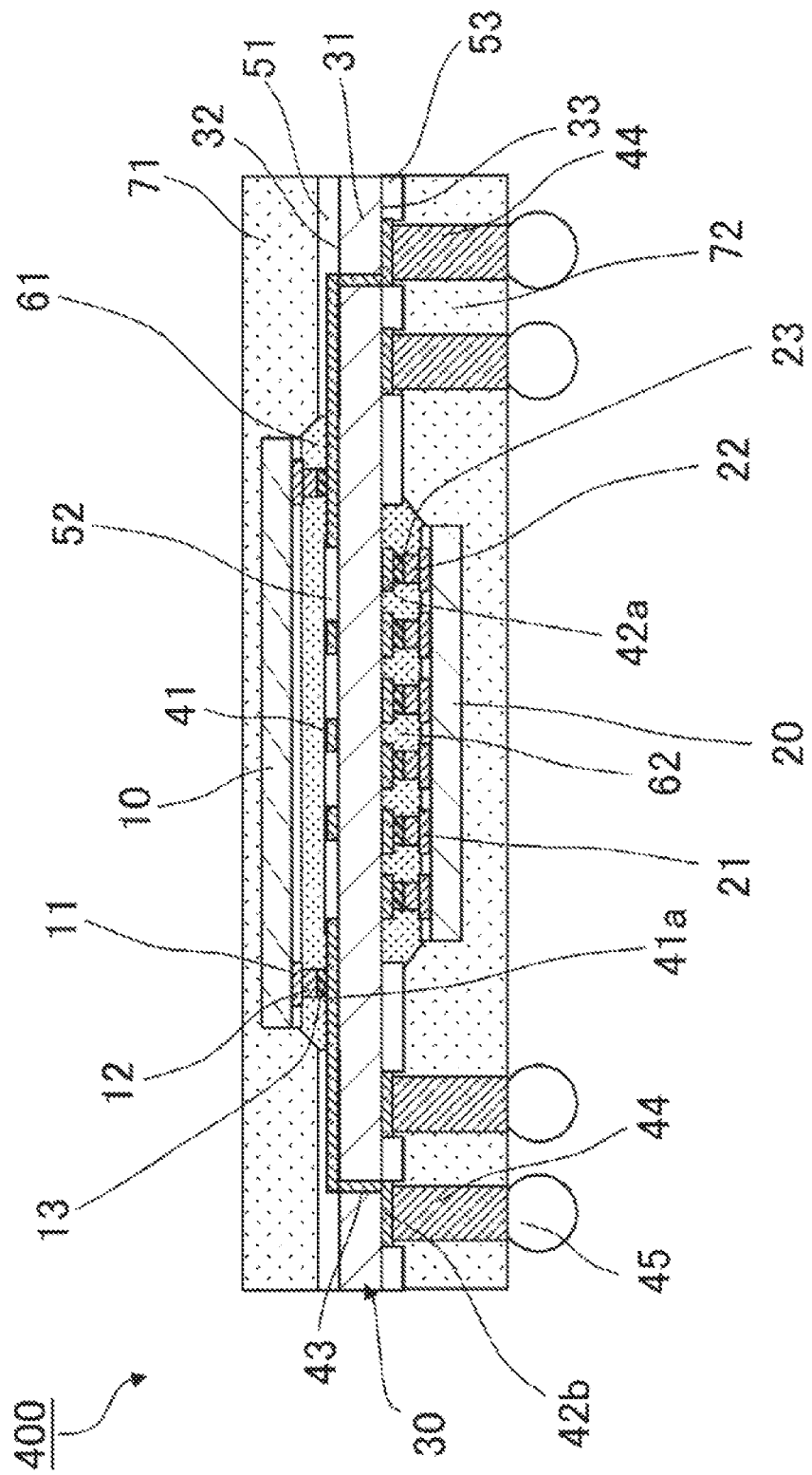
FIG. 19 is a cross-sectional view showing a configuration of a semiconductor device 400 according to a fourth embodiment of the present invention.

FIG. 19 is cross-sectional view showing a configuration of a semiconductor device 400 according to a fourth embodiment of the present invention.

As shown in FIG. 19, a characteristic of the semiconductor device 400 according to the present embodiment resides in a point that the thickness of the second sealing resin 72, which is formed on the second surface 33 of the wiring substrate 30, is thicker than the thickness of the first sealing resin 71, which is formed on the first surface 32. Other configurations are similar to those of the semiconductor device 100 according to the first embodiment.

Also in the present embodiment, effects similar to those of the first embodiment are obtained, the amount of the second sealing resin 72 is increased since the thickness of the second sealing resin 72 is increased, and minus warpage of the semiconductor device can be shifted to the direction of plus warpage. In the present embodiment, the second sealing resin 72 is thick in order to reduce the thickness of the semiconductor device 300. However, the thickness of the first sealing resin 71 may be reduced. Furthermore, the upper surface of the first semiconductor chip 10 may be exposed from the first sealing resin 71 by further reducing the thickness of the first sealing resin 71. By virtue of this configuration, heat dissipation performance of the semiconductor device can be further increased.

Figure 20:
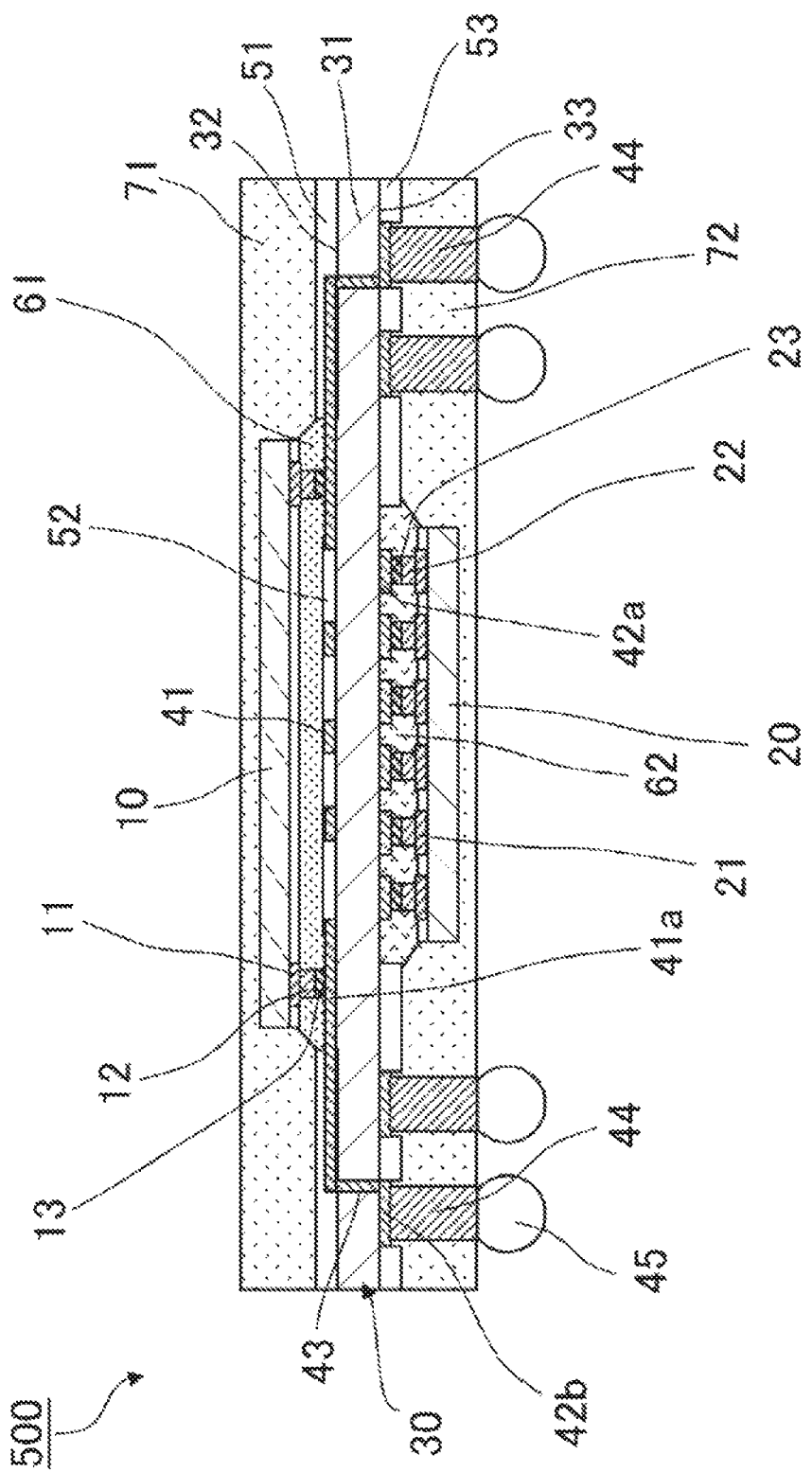
FIG. 20 is a cross-sectional view showing a configuration of a semiconductor device 500 according to a fifth embodiment of the present invention.

FIG. 20 is a cross-sectional view showing a configuration of a semiconductor device 500 according to a fifth embodiment of the present invention.

As shown in FIG. 20, a characteristic of the semiconductor device 500 according to the present embodiment resides in a point that the coefficient of linear expansion or the shrinkage ratio of the second underfill material 62, which fills the gap between the wiring substrate 30 and the second semiconductor chip 20, is larger than the coefficient of linear expansion and the shrinkage ratio of the first underfill material 61, which fills the gap between the wiring substrate 30 and the first semiconductor chip 10. Other configurations are similar to the semiconductor device 100 according to the first embodiment.

Also in the present embodiment, effects similar to those of the first embodiment are obtained, and minus warpage of the semiconductor device 500 can be reduced since the coefficient of linear expansion or the shrinkage ratio of the second underfill material between the wiring substrate 30 and the second semiconductor chip 20 is larger than that of the first underfill material.

Hereinabove, the preferred embodiments of the present invention have been explained. However, the present invention is not limited to the above described embodiments, various modifications can be made within the range not departing from the gist of the present invention, and it goes without saying that they are also included in the range of the present invention.

For example, although the wiring substrate 30 composed of the rigid insulating base material 31 is used in the first and second embodiments, a flexible insulating base material composed of, for example, polyimide may be used instead of the rigid insulating base material. Furthermore, the present invention can be also applied to a semiconductor device having a RDL (Re-Distribution Layer) structure which does not use an insulating base material.

Moreover, although the wiring substrate 30 on which the conductive posts 44 are formed is covered with the sealing resin 72 in the manufacturing processes shown in FIG. 8 to FIG. 14, the conductive posts 44 can be also formed by covering the wiring substrate 30, on which the conductive posts are not formed, with the sealing resin 72, then forming through holes in the sealing resin 72 by, for example, laser irradiation, and introducing a conductor such as solder into the through holes.

Furthermore, in the present embodiment, the back surfaces of the semiconductor chips mounted on the wiring substrate are configured to be covered with the sealing resins. However, the back surfaces of the semiconductor chips may be configured to be exposed from the sealing resins, for example, by grinding the sealing resins after formation of the sealing resins or forming the sealing resins so that the chip back surfaces are exposed.

We claim:

1. A method of forming a semiconductor device, the method comprising:
   mounting a first semiconductor chip to a first side of a substrate, the first semiconductor chip including a first short side and a plurality of first electrodes positioned along the first short side;
   mounting a second semiconductor chip to a second side of the substrate, the second semiconductor chip having a second short side and a plurality of second electrodes positioned along the second short side, wherein—
      the second semiconductor chip is mounted to the substrate such that (a) the first electrodes of the first semiconductor chip are laterally external to the second semiconductor chip, and (b) the second electrodes of the second semiconductor chip are laterally external to the first semiconductor chip,
      the second side is opposite the first side, and
      an outermost surface of the second semiconductor chip is separated from a surface of the substrate by a first distance;
   forming a plurality of conductive posts at the second side of the substrate, wherein an outermost surface of the conductive posts is separated from the surface of the substrate by a second distance greater than the first distance;
   sealing at least a portion of the first semiconductor chip with a first sealant; and
   sealing at least a portion of the second semiconductor chip and conductive posts with a second sealant.

2. The method of claim 1, further comprising removing a portion of the second sealant such that an outermost surface of the second sealant is generally co-planar with the outermost surface of the conductive posts.

3. The method of claim 1, further comprising mounting solder balls on the conductive posts.

4. The method of claim 1 wherein forming the conductive posts occurs before mounting the first chip and mounting the second chip.

5. The method of claim 1 wherein the first semiconductor chip is electrically coupled to the conductive posts via one or more conductive links extending through the substrate.

6. The method of claim 1 wherein forming the conductive posts includes disposing lands over the substrate and plating the conductive posts over corresponding lands.

7. The method of claim 1 wherein the surface of the substrate is a first surface, and the substrate includes a second surface opposite the first surface, the method further comprising providing a first insulating film over the first surface and a second insulating film over the second surface.

8. The method of claim 7 wherein at least one of the first insulating film or the second insulating film includes openings exposing connection pads electrically coupled to the conductive posts.

9. The method of claim 7 wherein at least one of the first insulating film and the second insulating film are rigid substrates.

10. The method of claim 1 wherein mounting a first semiconductor chip includes flip-chip bonding the first semiconductor chip to the first side of the substrate, and attaching the first semiconductor chip to the substrate via an underfill material.

11. The method of claim 1 wherein the first sealant and the second sealant are sealing resins.

12. The method of claim 1 wherein:
   the substrate includes a rectangular shape having a first side and a second side longer than the first side of the substrate,
   the first semiconductor chip includes a rectangular shape having a first side and a second side longer than the first side of the first semiconductor chip,
   the second semiconductor chip includes a rectangular shape having a first side and a second side longer than the first side of the second semiconductor chip,
   mounting a first semiconductor chip includes mounting the first semiconductor chip such that the second side of the first semiconductor chip is generally parallel to the second side of the substrate and generally perpendicular to the second side of the second semiconductor chip.

13. A method of manufacturing a package-on-package semiconductor device, the method comprising:
   disposing a first insulating layer over a first surface of a substrate, wherein the first insulating layer includes a plurality of first openings corresponding to first connection pads on the substrate;
   disposing a second insulating layer over a second surface of the substrate, wherein the second insulating layer includes a plurality of second openings corresponding to second connection pads on the substrate;
   forming a plurality of conductive posts over corresponding second connection pads of the substrate, wherein the conductive posts extend away from the substrate in the second direction;
   electrically coupling a first semiconductor chip to the substrate via the first connection pads, wherein the first semiconductor chip faces a first direction, and wherein the first semiconductor chip includes a first short side and a plurality of first electrodes positioned along the first short side;
   electrically coupling a second semiconductor chip to the substrate via the second connection pads, wherein— the second semiconductor chip includes a second short side and a plurality of second electrodes positioned along the second short side, the second semiconductor chip is positioned over the first semiconductor chip such that (a) the first electrodes of the first semiconductor chip are laterally external to of the second semiconductor chip, and (b) the second electrodes of the second semiconductor chip are laterally external to the first semiconductor chip, and the second semiconductor chip faces a second direction generally opposite the first direction;

sealing at least a portion of the first semiconductor chip with a first sealant; and sealing at least a portion of the second semiconductor chip and conductive posts with a second sealant.

14. The method of claim 13 wherein:

electrically coupling a first semiconductor chip includes mounting the first semiconductor chip over the first surface of the substrate, and electrically coupling a second semiconductor chip includes mounting the second semiconductor chip over the second surface of the substrate.

15. The method of claim 13, further comprising:

attaching the first semiconductor chip to the substrate via a first adhesive material; and attaching the second semiconductor chip to the substrate via a second adhesive material.

16. The method of claim 13, further comprising:

removing a portion of the second sealant such that a surface of the conductive posts is exposed; and disposing electrical connectors over the exposed surface of the conductive posts.

17. The method of claim 16, further comprising electrically coupling the first semiconductor chip to the electrical connectors via a conductor extending through the substrate.

18. The method of claim 13 wherein:

an outermost surface of the second semiconductor chip extends from the second surface of the substrate by a first distance, and an outermost surface of the conductive posts extend from the second surface of the substrate by a second distance greater than the first distance.

19. A method of manufacturing a wafer having one or more package-on-package (POP) devices, the method comprising:

providing a first semiconductor chip including a first short side and a plurality of first electrodes positioned along the first short side, and a second semiconductor chip including a second short side and a plurality of second electrodes positioned along the second short side;

mounting the first semiconductor chip over a first side of a substrate;

mounting the second semiconductor chip to a second side of the substrate such that (a) the first electrodes of the first semiconductor chip are laterally external to the second semiconductor chip, and (b) the second electrodes of the second semiconductor chip are laterally external to the first semiconductor chip, wherein the second side is generally opposite the first side;

forming a plurality of conductive posts at the second side of the substrate;

sealing at least a portion of the first semiconductor chip with a first sealant; and sealing at least a portion of the second semiconductor chip and conductive posts with a second sealant.

20. The method of claim 19, further comprising dicing the wafer along dicing lines to form individual POP devices.

21. The method of claim 19 wherein the surface of the substrate is a first surface, the method further comprising providing a first insulating film over the first surface and a second insulating film over the second surface.

22. The method of claim 21 wherein the second insulating film includes openings exposing connection pads electrically coupled directly to corresponding conductive posts.

23. The method of claim 19 wherein the first and second semiconductor chips include memory chips.

* * * * *